(12) United States Patent
Watanabe

(10) Patent No.: US 7,446,414 B2
(45) Date of Patent: Nov. 4, 2008

(54) SEMICONDUCTOR DEVICE

(75) Inventor: Kiyonori Watanabe, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 49 days.

(21) Appl. No.: 11/544,627

(22) Filed: Oct. 10, 2006

(65) Prior Publication Data

US 2007/0108606 A1    May 17, 2007

(30) Foreign Application Priority Data

Nov. 17, 2005    (JP)    ............................. 2005-333414

(51) Int. Cl.
   *H01L 23/48*    (2006.01)
   *H01L 23/52*    (2006.01)
   *H01L 29/40*    (2006.01)

(52) U.S. Cl. ................ 257/737; 257/736; 257/738; 257/778

(58) Field of Classification Search ......... 257/730–736, 257/688–777
See application file for complete search history.

(56) References Cited

U.S. PATENT DOCUMENTS

| | | | |
|---|---|---|---|
| 2004/0089944 A1* | 5/2004 | Watanabe | 257/734 |
| 2004/0099955 A1* | 5/2004 | Shizuno | 257/758 |
| 2004/0130022 A1* | 7/2004 | Shizuno | 257/735 |
| 2004/0150104 A1* | 8/2004 | Terui | 257/734 |
| 2005/0189068 A1* | 9/2005 | Suzuki et al. | 156/345.3 |
| 2005/0230794 A1* | 10/2005 | Shizuno | 257/678 |
| 2007/0269665 A1* | 11/2007 | Shimoohsako et al. | 428/458 |

FOREIGN PATENT DOCUMENTS

| | | |
|---|---|---|
| JP | 2001-135742 | 5/2001 |
| JP | 2003-060120 | 2/2003 |

* cited by examiner

*Primary Examiner*—Zandra Smith
*Assistant Examiner*—Telly D Green
(74) *Attorney, Agent, or Firm*—Rabin & Berdo, PC

(57) ABSTRACT

A semiconductor device includes a semiconductor substrate, an electrode pad electrically connected to a circuit element formed on the semiconductor substrate, a connection wiring electrically connected to the electrode pad and extending on the semiconductor substrate, and a post electrode formed on the connection wiring. The semiconductor device further includes an adhesion film formed on the side surface of the post electrode, and a sealing layer that has light-shielding property and seals the surface of the adhesion film and the connection wiring.

10 Claims, 13 Drawing Sheets

(P1)

(P2)

(P3)

(P4)

(P5)

(P6)

(P7)

(P8)

(P9)

(P10)

(PA1)

(PA2)

(PA3)

(PA4)

(PA5)

(PA6)

(PA7)

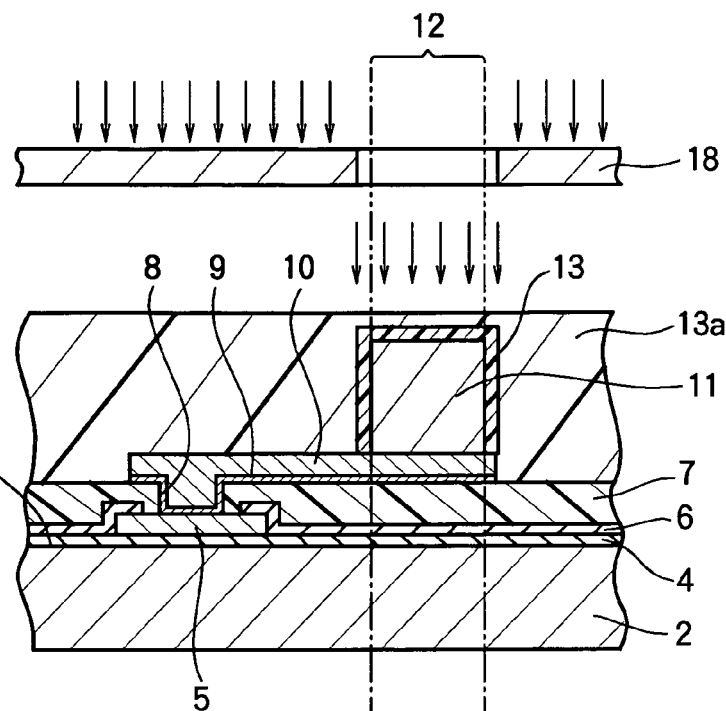
FIG. 6A (PA8)
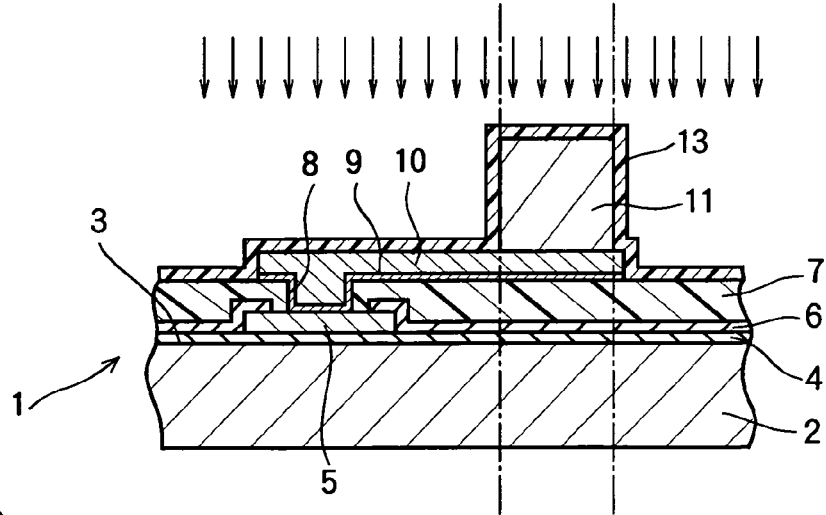
FIG. 6B (PA9)
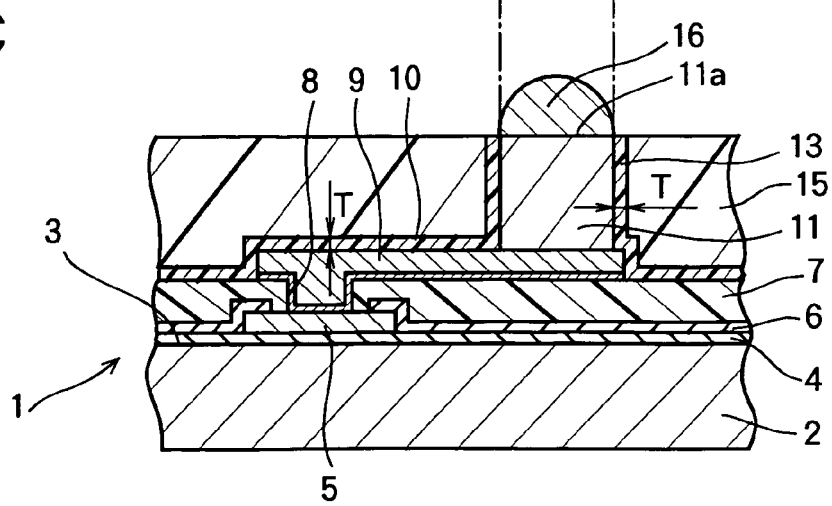
FIG. 6C (PA10)

FIG.7A (PB1)
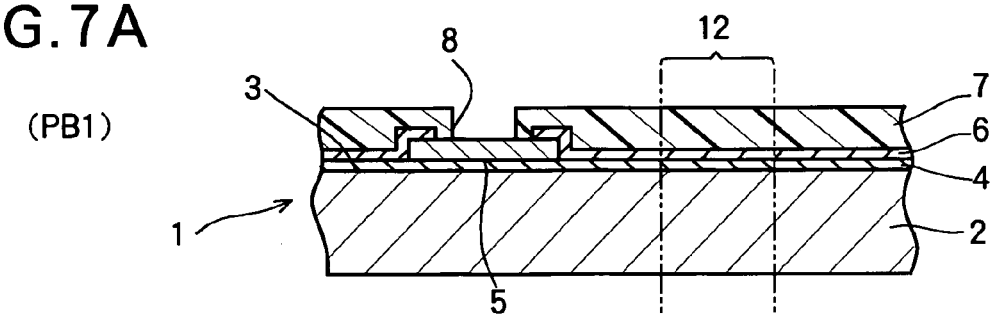
FIG.7B (PB2)
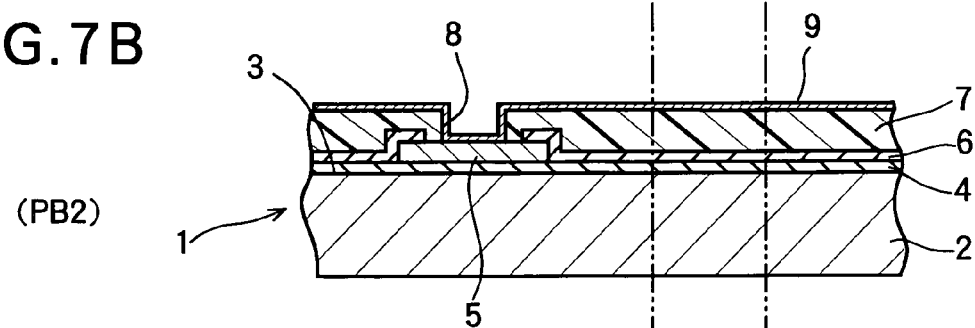
FIG.7C (PB3)
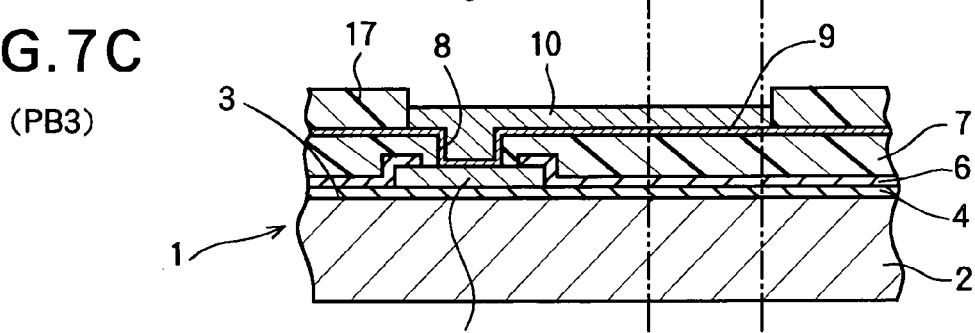
FIG.7D (PB4)
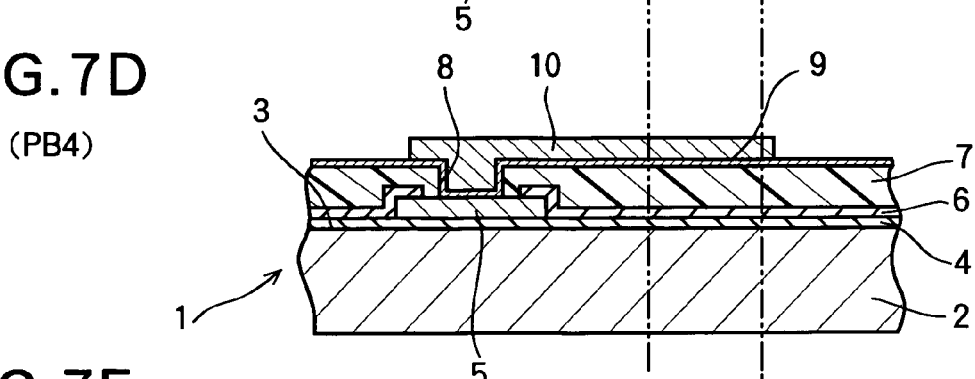
FIG.7E (PB5)
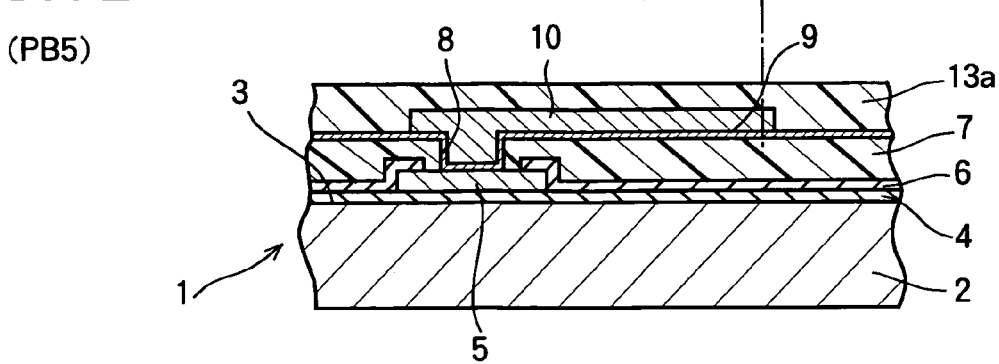

FIG.8A (PB6)
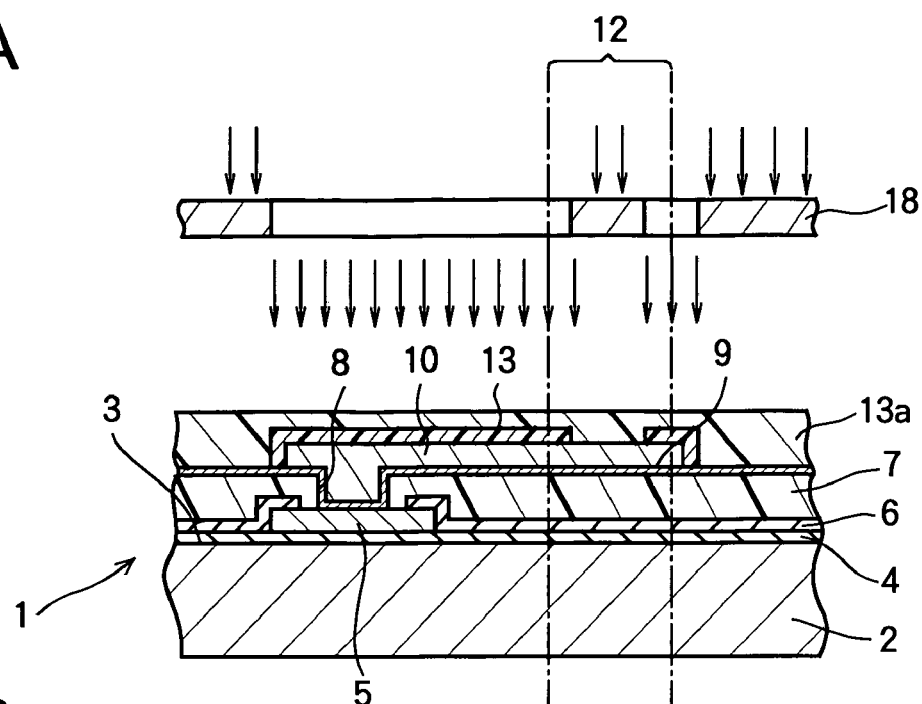
FIG.8B (PB7)
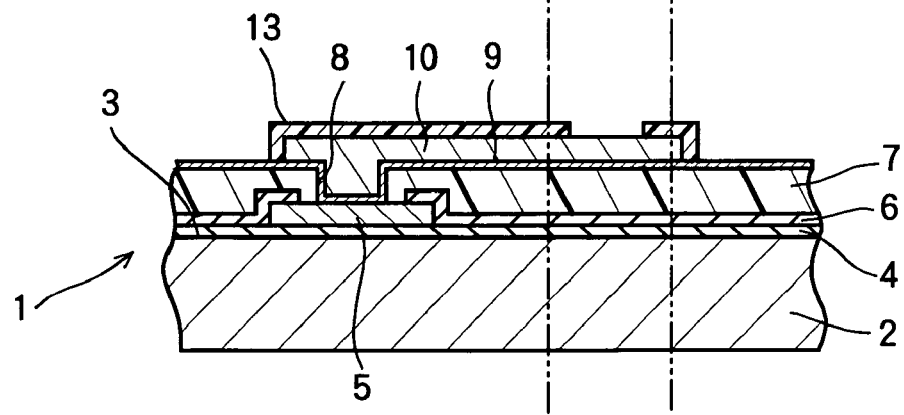
FIG.8C (PB8)
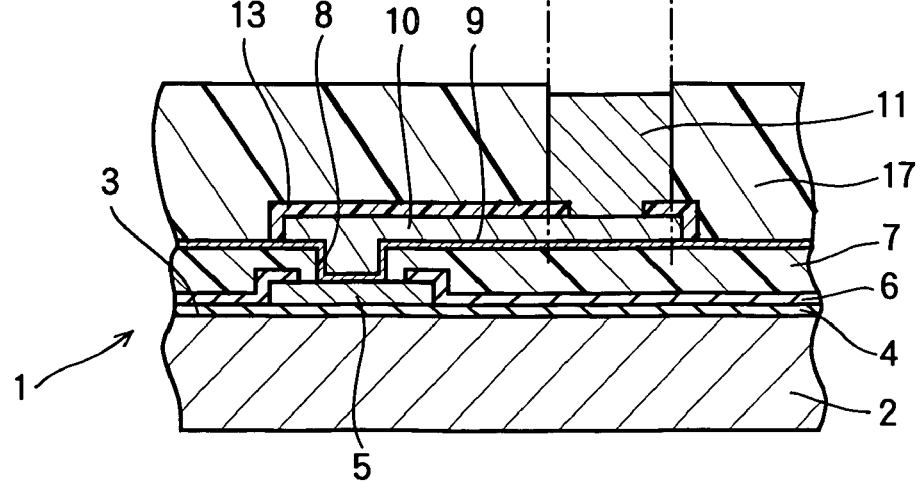

(PB9)

(PB10)

(PB11)

(PB12)

(PC1)

(PC2)

(PC3)

(PC4)

(PC5)

(PC6)

(PC7)

(PC8)

(PC9)

(PC10)

SEMICONDUCTOR DEVICE

BACKGROUND OF THE INVENTION

This invention relates to a small size semiconductor device as typified by WCSP (Wafer-level Chip Size Package) manufactured by forming a plurality of circuit elements on a semiconductor wafer and dividing the semiconductor wafer into individual pieces. This invention also relates to a manufacturing method of the semiconductor device.

Recently, there is a strong need for reducing the size and thickness of a semiconductor device on which semiconductor elements are mounted. In particular, a CSP (Chip Scale Package) type semiconductor device is mainly used as a thin semiconductor chip. The CSP semiconductor device includes spherical bump electrodes disposed on the upper surface thereof.

A manufacturing method of the conventional CSP type semiconductor device will be described below. Circuit elements are formed on the upper surface of a semiconductor wafer. An insulation layer is formed to cover the circuit elements on the upper surface of the semiconductor wafer. Electrode pads are formed on the insulation layer so that the electrode pads are electrically connected to the circuit elements. A surface protection film is formed on the insulation layer and on the edges of the electrode pads. An interlayer insulation film with through-holes (reaching the electrode pads) are formed on the surface protection film, and a base metal layer is formed on the interlayer insulation film. Connection wirings composed of copper (Cu) or the like are formed on the base metal layer so that the connection wirings reach electrode-forming areas (on which post electrodes are to be formed) from the electrode pads. The post electrodes (composed of copper or the like) having the height of approximately 100 μm are formed on the base metal layer by means of photolithography. Then, the semiconductor wafer is placed in a sealed mold, and epoxy resin is injected into the sealed mold to cover the upper side of the semiconductor wafer, so that a sealing layer is formed. The surface of the sealing layer is polished so that end surfaces (i.e., post end surfaces) of the post electrodes are exposed. Hemispheric bump electrodes are formed on the post end surfaces. Then, the semiconductor wafer is divided into individual pieces, with the result that the semiconductor device is manufactured. Such a manufacturing method is disclosed in, for example, Japanese Laid-Open Patent Publication No. 2003-60120 (see paragraphs 0047-0066 and FIGS. 7-10) hereinafter referred to as Patent Publication No. 1.

Another manufacturing method of the conventional CSP type semiconductor device will be described below. Electrode pads are formed to be electrically connected to the circuit elements formed on the upper surface of a semiconductor wafer. A surface protection film is formed to cover the side surfaces of the electrode pads. An interlayer insulation film with through-holes (reaching the electrode pads) is formed on the surface protection film. A metal thin-film layer is formed to cover the through holes and the interlayer insulation film. Post electrodes of copper are formed on the metal thin-film layer. Then, the metal thin-film layer is patterned, to thereby form connection wirings. Further, an insulation layer of photosensitive polyimide is formed by photolithography to cover the connection wirings, the interlayer insulation film and side surfaces of the post electrodes (near the ends of the post electrodes) so that end surfaces of the post electrodes are exposed. A sealing layer of photosensitive sealing resin is formed on the upper side of the semiconductor wafer, in order to enhance the contact between the insulation layer and the post electrodes, and to thereby prevent the disconnection between the connection wirings and the post electrodes. Such a manufacturing method is disclosed in, for example, Japanese Laid-Open Patent Publication No. 2001-135742 (see paragraphs 0021-0032, 0048-0053 and FIGS. 2-3) hereinafter referred to as Patent Publication No. 2.

However, in the conventional art disclosed in Patent Publication No. 1, since the side surfaces of the post electrodes are sealed by the sealing resin of epoxy resin, it is difficult to ensure sufficient adhesion between the side surface of each post electrode and the sealing resin. Therefore, when the bump electrodes are bonded to the post electrodes in the mounting process of the semiconductor device on the mounting substrate, a difference in thermal expansion between the semiconductor device and the mounting substrate causes an external force to be concentrated on the post electrodes via the bump electrodes, with the result that the post electrodes and the sealing layer may separate from each other. In such a case, moisture in the air or the like may intrude through gaps between the post electrodes and the sealing layer, and may cause corrosion of the electrode posts or connection wirings. If an external force is repeatedly applied to the corroded connection wirings or the like, the disconnection of the connection wirings may occur, or crack may be generated on the lower layer. Thus, the reliability of connection of the semiconductor device may be degraded.

This problem is noticeable particularly when the post electrodes are formed of copper.

In the conventional art disclosed in Patent Publication No. 2, the connection wirings, the interlayer insulation film and the post electrodes are covered by the insulation layer of photosensitive polyimide, and is sealed by the sealing layer of photosensitive sealing resin. Such an arrangement is effective in preventing the separation between the post electrodes and the insulation layer. However, both of the photosensitive polyimide and the photosensitive sealing resin transmit light. Therefore, if the semiconductor device is exposed to light after the semiconductor device is mounted on the mounting substrate, the memory of the circuit elements may be erased by ultraviolet rays.

SUMMARY OF THE INVENTION

An object of the present invention is to provide a semiconductor device capable of enhancing the reliability of connection of the semiconductor device and to exclude the influence of ultraviolet rays.

The present invention provides a semiconductor device including a semiconductor substrate, an electrode pad electrically connected to a circuit element formed on the semiconductor substrate, a connection wiring electrically connected to the electrode pad and extending on the semiconductor substrate, a post electrode formed on the connection wiring, an adhesion film formed to cover the side surface of the post electrode, and a sealing layer that has light-shielding property and seals the surface of the adhesion film and the connection wiring.

With such an arrangement, the side surface of the post electrode tightly adheres to the sealing layer via the adhesion film. Therefore, even when an external stress is applied to the post electrode, it becomes possible to prevent the separation between the post electrode and the sealing layer, and to prevent the intrusion of the moisture or the like from outside. Thus, the corrosion or disconnection of the connection wiring can be prevented, and therefore the reliability of connection of the semiconductor device can be enhanced. Moreover, the adhesion film is covered by the sealing layer having light-shielding property, and therefore it becomes possible to prevent the circuit element of the semiconductor device from being exposed to the ultraviolet rays or the like after the semiconductor is mounted on the mounting substrate. Therefore, it becomes possible to prevent the memory of the circuit element from being erased.

BRIEF DESCRIPTION OF THE DRAWINGS

In the attached drawings:

FIGS. 6A through 6C are sectional views illustrating processes PA8 through PA10 of the manufacturing method of the semiconductor device according to the second embodiment of the present invention;

FIGS. 7A through 7E are sectional views illustrating processes PB1 through PB5 of a manufacturing method of a semiconductor device according to the third embodiment of the present invention;

FIGS. 8A through 8C are sectional views illustrating processes PB6 through PB8 of the manufacturing method of the semiconductor device according to the third embodiment of the present invention;

DETAILED DESCRIPTION OF THE PREFERRED EMBODIMENT

Figure 1A:
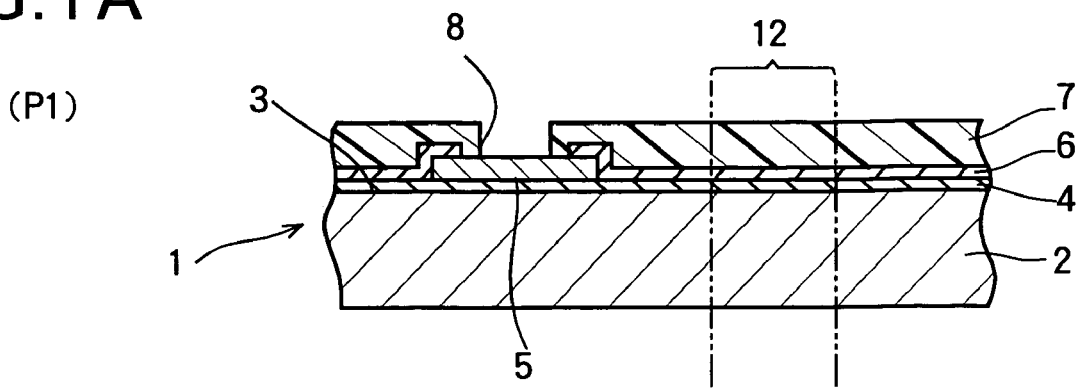
FIGS. 1A through 1D are sectional views illustrating processes P1 through P4 of a manufacturing method of a semiconductor device according to the first embodiment of the present invention.

Embodiments of the present invention will be described with reference to the attached drawings.

First Embodiment

FIGS. 1A through 1D, FIGS. 2A through 2C and FIGS. 3A through 3C illustrate a manufacturing method of a semiconductor device according to the first embodiment of the present invention. FIGS. 1A through 3C are sectional views of a semiconductor device, and particularly show the vicinity of electrode pads and post electrodes connected to the electrode pads via connection wirings. In FIGS. 1A through 3C, only one electrode pad, one post electrode and one connection wiring are shown.

As shown in FIGS. 1A through 3C, a numeral 1 denotes a semiconductor wafer for manufacturing a plurality of CSP type semiconductor devices.

The semiconductor wafer 1 includes a semiconductor substrate 2 composed of silicon. A plurality of circuit elements are formed on the upper surface of the semiconductor substrate 2. The circuit elements are made of semiconductor elements connected to each other via connection wirings. The upper surface of the semiconductor substrate 2 on which the circuit elements are formed is referred to as a circuit-forming surface 3.

An insulation layer 4 composed of silicon dioxide ($SiO_2$) or the like is formed on the circuit-forming surface 3 of the semiconductor substrate 2 using a CVD (Chemical Vapor Deposition) method or the like. The insulation layer 4 has not shown contact-holes formed above the respective circuit elements on the semiconductor substrate 2.

Electrode pads 5 are formed by forming a conductive layer of conductive material (such as aluminum (Al), titanium (Ti) or the like) on the insulation layer 4 using a sputtering method or the like, and etching the conductive layer into a predetermined shape. The electrode pads 5 are electrically connected to predetermined portions of the circuit elements via conductive bodies filled in the contact-holes of the insulation layer 4.

A surface protection film 6 composed of silicon nitride ($Si_3N_4$) is formed using the CVD method or the like. The surface protection film 6 covers an upper surface of the insulation layer 4 and peripheries of the electrode pads 5.

An interlayer insulation film 7 composed of insulation material such as polyimide or the like is formed on the surface protection film 6. Through-holes 8 are formed on the interlayer insulation film 7 so that the through-holes 8 reach the electrode pads 5. The through-holes 8 are formed by removing the portions of the interlayer insulation film 7 positioned above the electrode pads 5 by means of etching.

A base metal layer 9 (i.e., a metal thin-film layer) is formed to cover the upper surface of the interlayer insulation film 7, the inner surfaces of the through-holes 8 and the upper surfaces of the electrode pads 5. The base metal layer 9 is formed of a plurality of layers of titan (Ti), titan nitride (TiN), copper (Cu) or the like, and is formed on the whole surface of the upper side of the semiconductor wafer 1 using the sputtering method.

Connection wirings 10 are formed of a wiring pattern and formed by masking the areas of the base metal layer 9 except wiring-forming areas (where the connection wirings 10 are to be formed) extending from portions above the electrode pads 5 to electrode-forming areas 12 (where post electrodes 11 are to be formed) using photolithography or the like, and by electrodepositing conductive materials such as copper or the like on exposed areas of the base metal layer 9 using electroplating (in which the base metal layer 9 is used as a common electrode). The connection wirings 10 are electrically connected to the electrode pads 5 via the base metal layer 9. The connection wirings 10 extend above the semiconductor substrate 2 from the electrode pads 5 to the post electrodes 11, and electrically connect the electrode pads 5 and the post electrodes 11 to each other.

The post electrodes 11 are formed by masking the areas of the connection wirings 10 except the electrode-forming areas 12 using photolithography or the like, and by electrodepositing the same material as the connection wirings 10 on exposed areas of the connection wirings 10 using electro-plating method (in which the base metal layer 9 is used as a common electrode). The post electrodes 11 are columnar protrusions having the height of approximately 100 µm.

An adhesion film 13 is a half-transparent film that transmits light and has an insulation property. The adhesion film 13 is formed as described below. An adhesion resin 13a composed of photosensitive polyimide-based material with positive or negative photosensitivity is coated on the upper side of the semiconductor wafer 1. Using photolithography, the adhesion resin 13a is exposed to ultraviolet rays or the like, and is developed. Then, the adhesion resin 13a is heated to vaporize volatile components such as solvent, so that the adhesion resin 13a is solidified. The adhesion film 13 tightly adheres to the post electrodes 11 and also tightly adheres to a sealing layer 15. The adhesion film 13 has a uniform thickness, and covers each post electrode 11 from the post end surface 11a to a portion where the post electrode 11 is joined with the connection wiring 10.

The adhesion resin 13a used in this embodiment is a polyimide resin having photosensitivity, and has a light-transmission property, an insulation property and low-moisture absorbency.

The sealing layer 15 is formed by coating or injecting a sealing resin such as thermosetting epoxy resin on the upper side of the semiconductor wafer 1, and heating and hardening the sealing resin. The sealing layer 15 is an opaque layer having insulation property and light-shielding property that shields light such as ultraviolet rays from outside. The sealing layer 15 has a function to protect the semiconductor device from outside moisture. In order to seal the semiconductor device, the sealing layer 15 is formed to cover the interlayer insulation film 7, the base metal layer 9, the connection wirings 10 and the adhesion film 13 (formed on side surfaces of the post electrodes 11) so that the surface of the sealing layer 15 and the post end surfaces 11a are aligned with each other on the same plane. The adhesion film 13 is covered by the sealing layer 15, except end surfaces of the adhesion film 13 around the post end surfaces 11a.

The sealing layer 15 of this embodiment is formed by heating and hardening a thermosetting epoxy resin to a thickness of approximately 100 µm. The sealing layer 15 has a sufficient light shielding property when the thickness of the sealing layer 15 is thicker than or equals to 60 µm.

Bump electrodes 16 are hemispheric electrodes formed on the post end surfaces 11a of the post electrodes 11 by means of a solder ball method, a screen printing method or the like. The bump electrodes 16 are connected to connection terminals of a not-shown mounting substrate, and function as external terminals of the semiconductor device. With such an arrangement, the circuit elements formed on the semiconductor substrate 2 are connected to an external device via the electrode pads 5, the base metal layer 9, the connection wirings 10, the post electrodes 11 and the bump electrodes 16.

A resist mask 17 is formed by coating a resist on the upper side of the semiconductor wafer 1, exposing the resist, and developing the resist using photolithography.

Figure 3A:
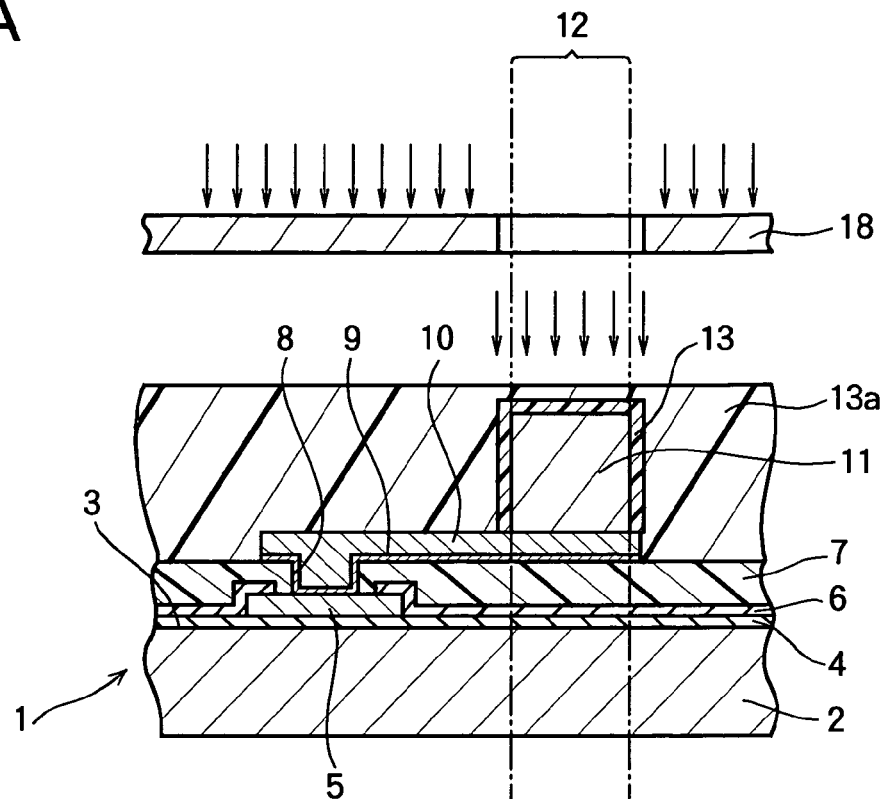
FIGS. 3A through 3C are sectional views illustrating processes P8 through P10 of the manufacturing method of the semiconductor device according to the first embodiment of the present invention.
Figure 3B:
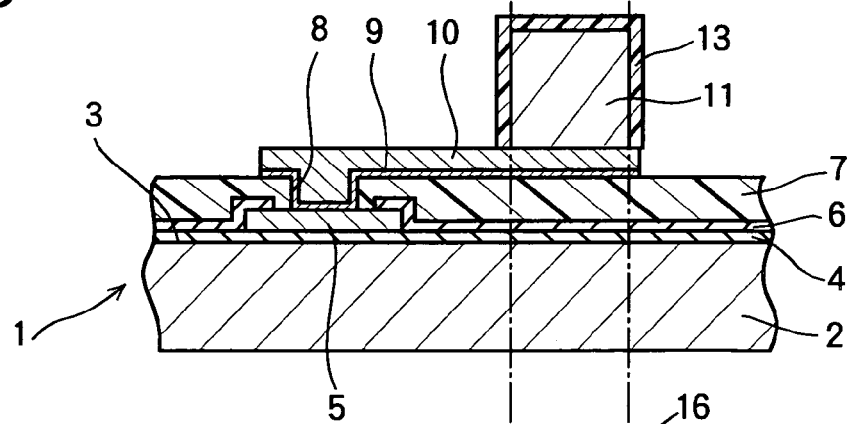
Figure 3C:
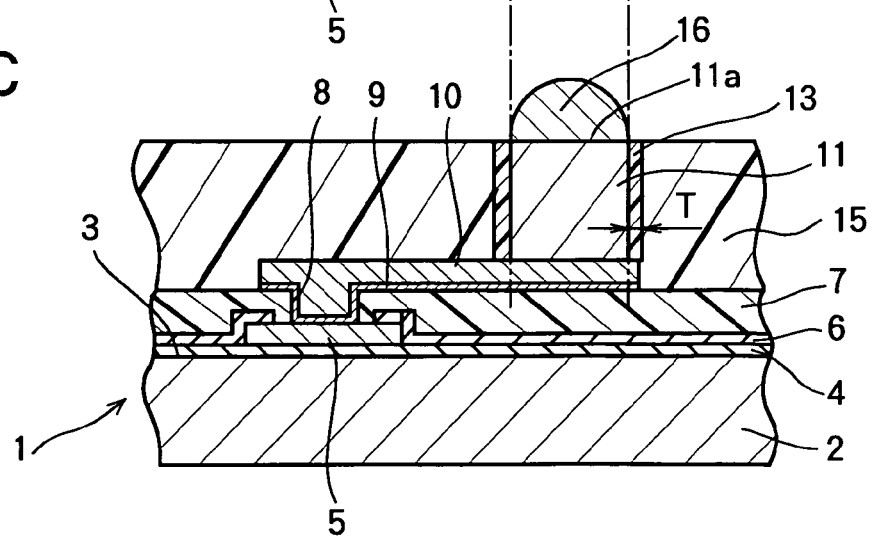
Figure 4A:
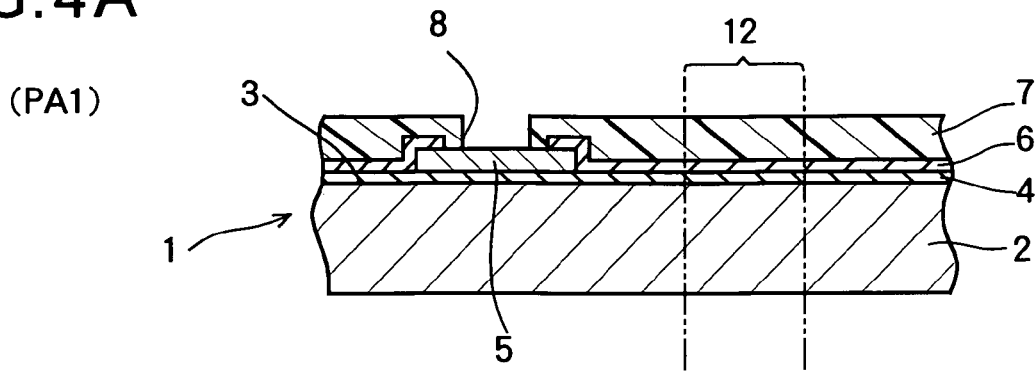
FIGS. 4A through 4D are sectional views illustrating processes PA1 through PA4 of a manufacturing method of a semiconductor device according to the second embodiment of the present invention.
Figure 4B:
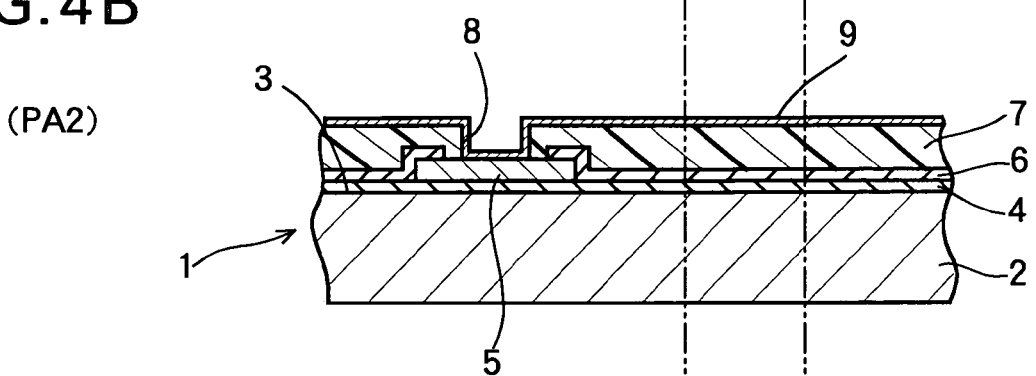
Figure 4C:
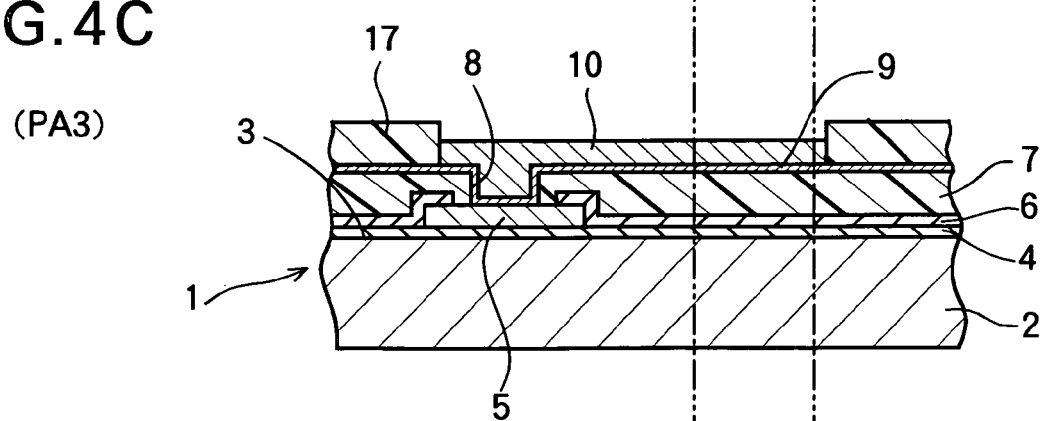
Figure 4D:
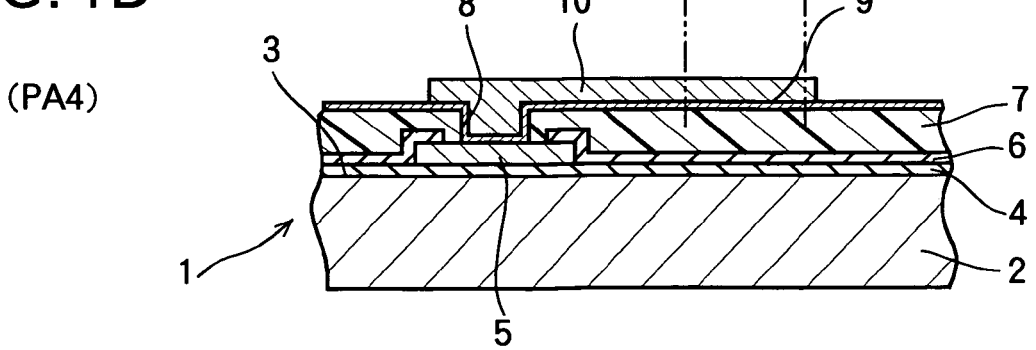
Figure 5A:
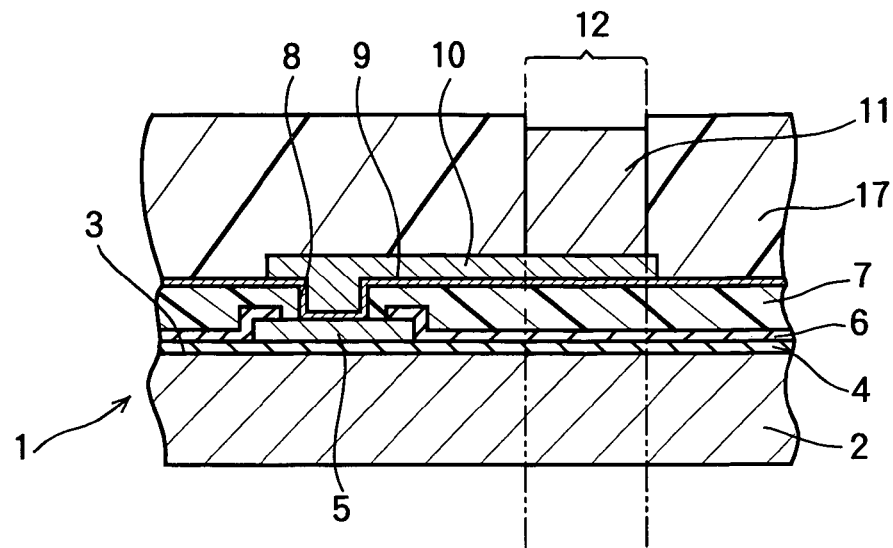
FIGS. 5A through 5C are sectional views illustrating processes PA5 through PA7 of the manufacturing method of the semiconductor device according to the second embodiment of the present invention.
Figure 5B:
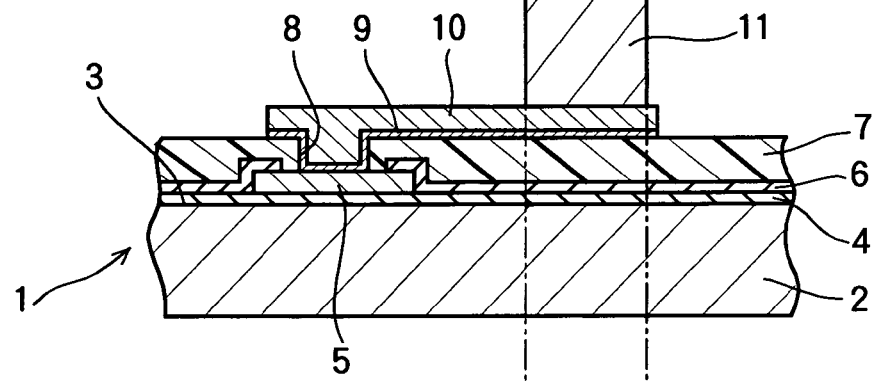
Figure 5C:
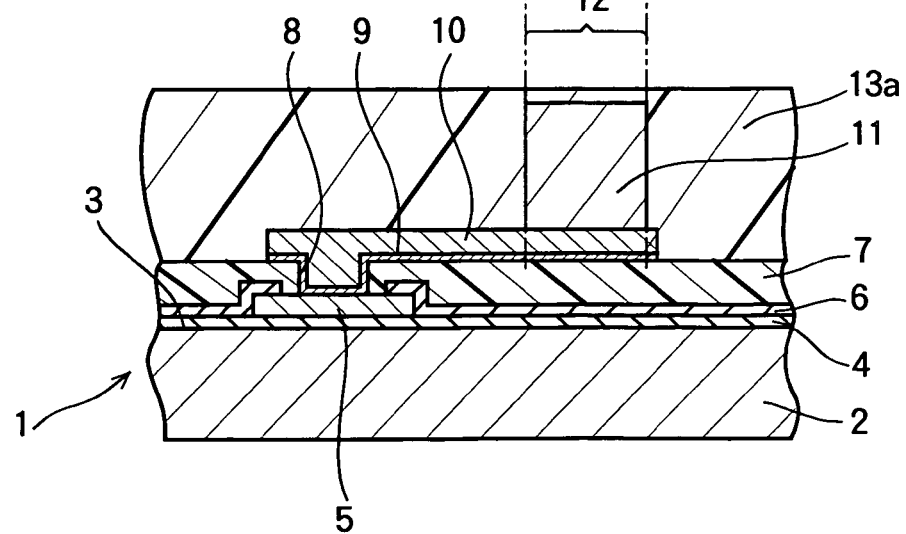
Figure 9A:
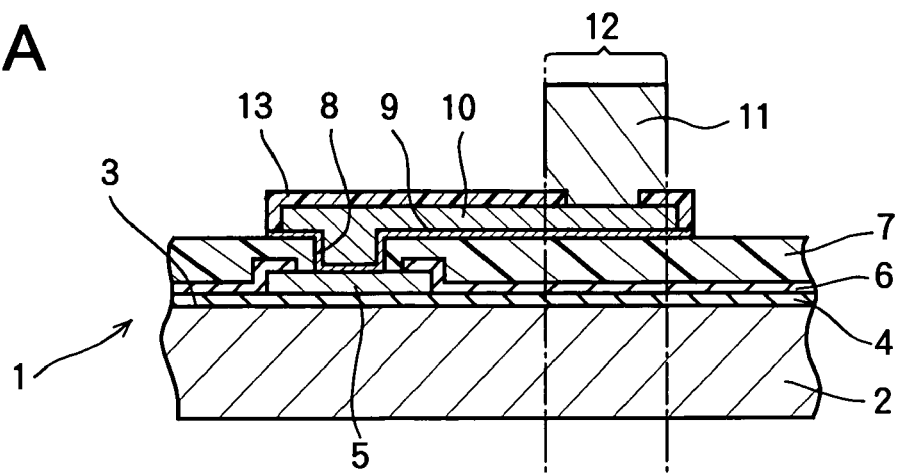
FIGS. 9A through 9C are sectional views illustrating processes PB9 through PB11 of the manufacturing method of the semiconductor device according to the third embodiment of the present invention.
Figure 9B:
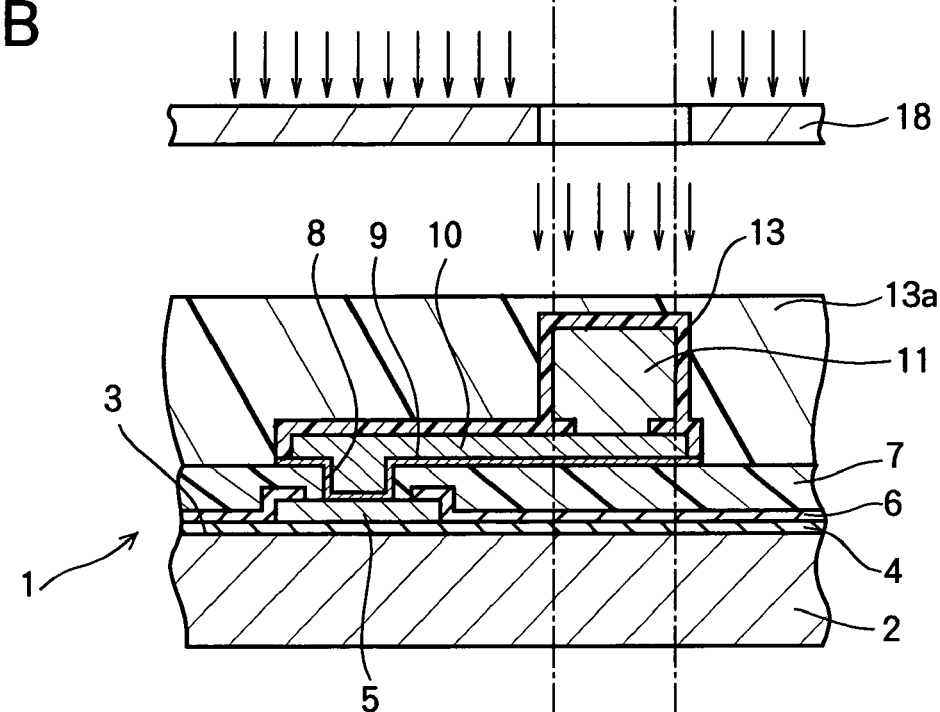
Figure 9C:
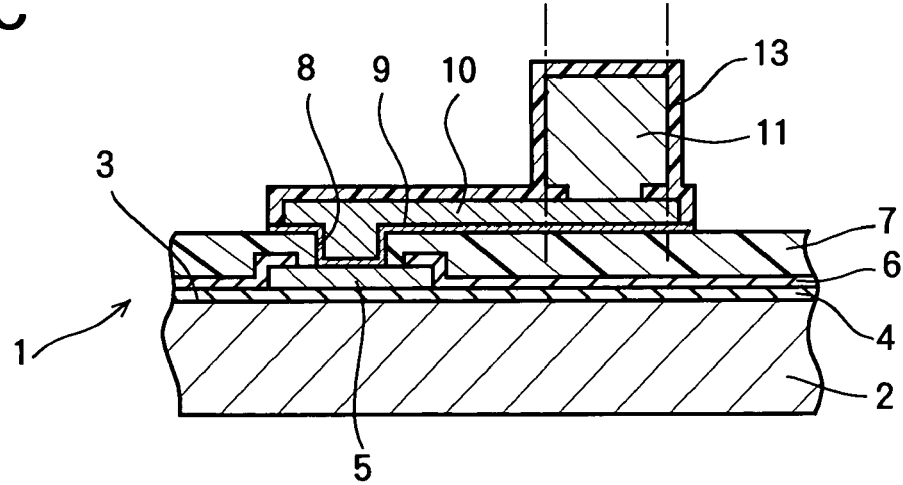
Figure 10:
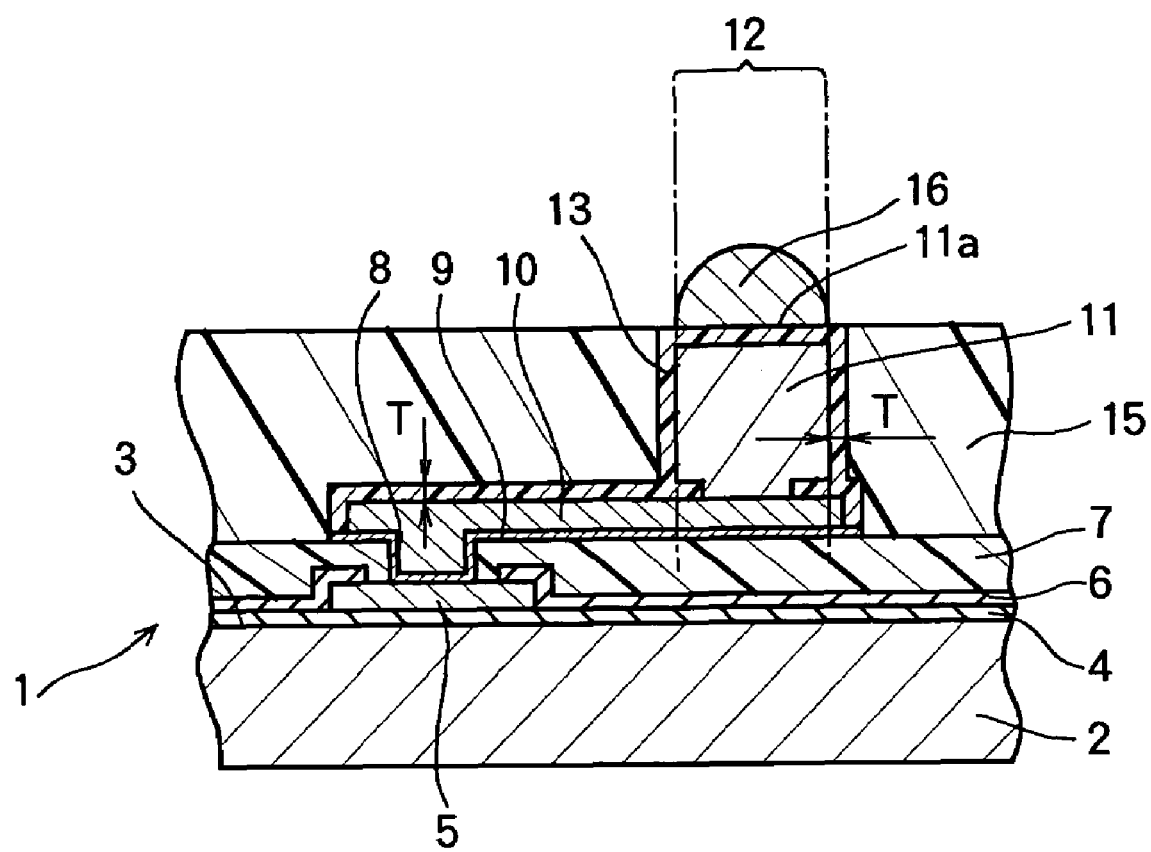
FIG. 10 is a sectional views illustrating a process PB12 of the manufacturing method of the semiconductor device according to the third embodiment of the present invention.
Figure 11A:
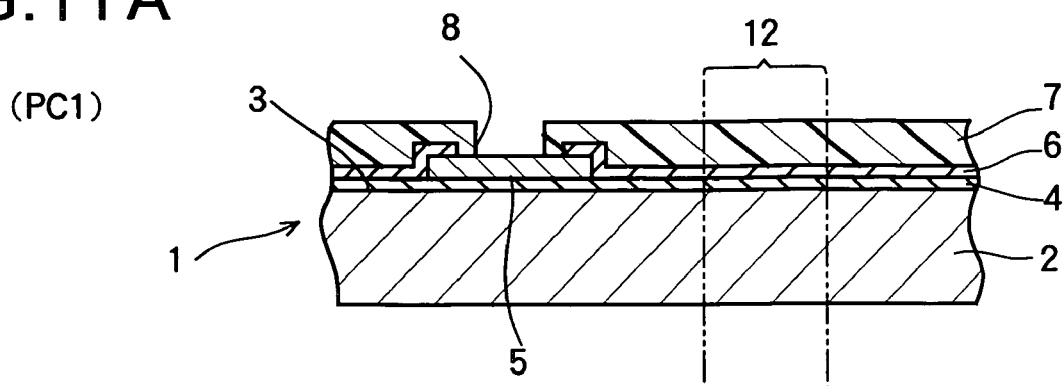
FIGS. 11A through 11D are sectional views illustrating processes PC1 through PC4 of a manufacturing method of a semiconductor device according to the fourth embodiment of the present invention.
Figure 11B:
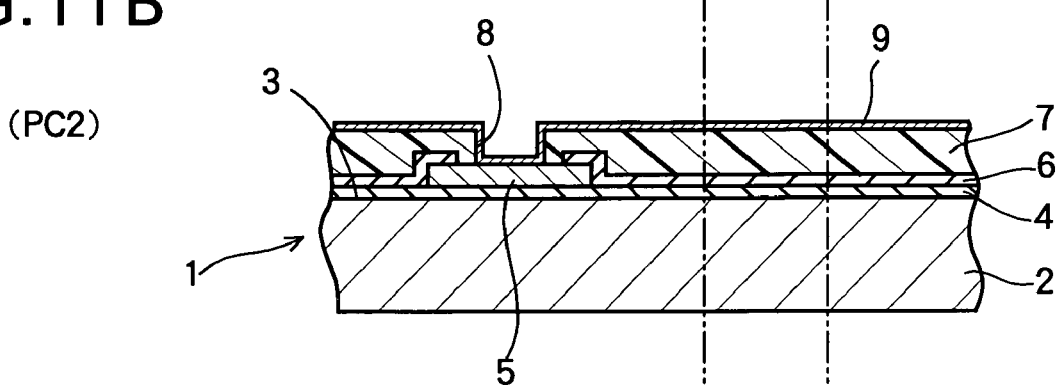
Figure 11C:
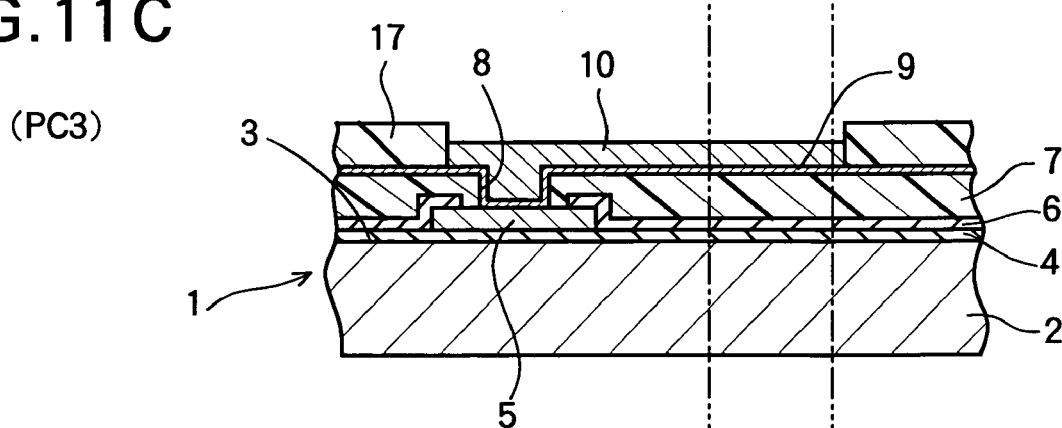
Figure 11D:
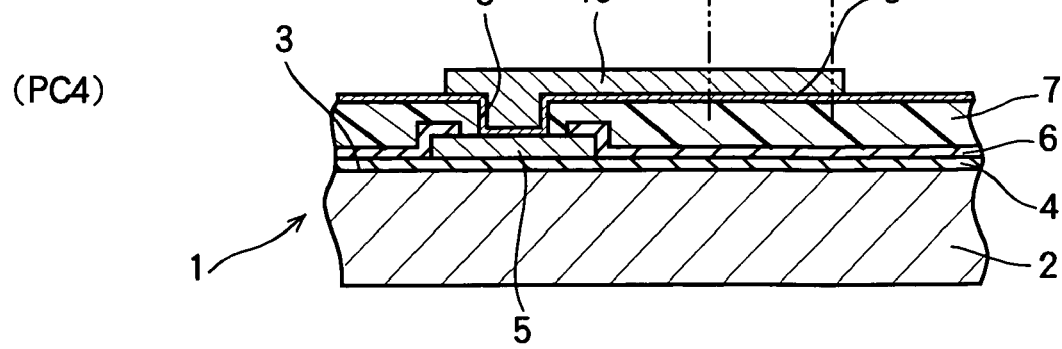
Figure 12A:
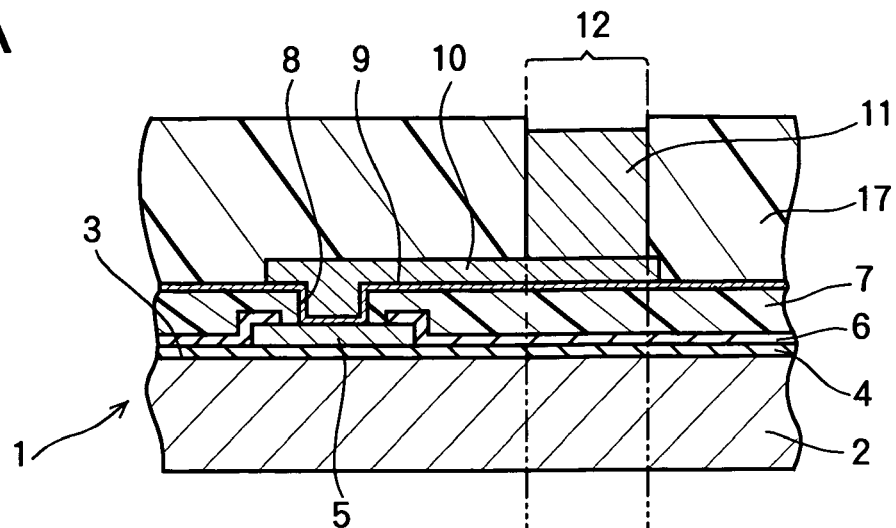
FIGS. 12A through 12C are sectional views illustrating processes PC5 through PC7 of the manufacturing method of the semiconductor device according to the fourth embodiment of the present invention.
Figure 12B:
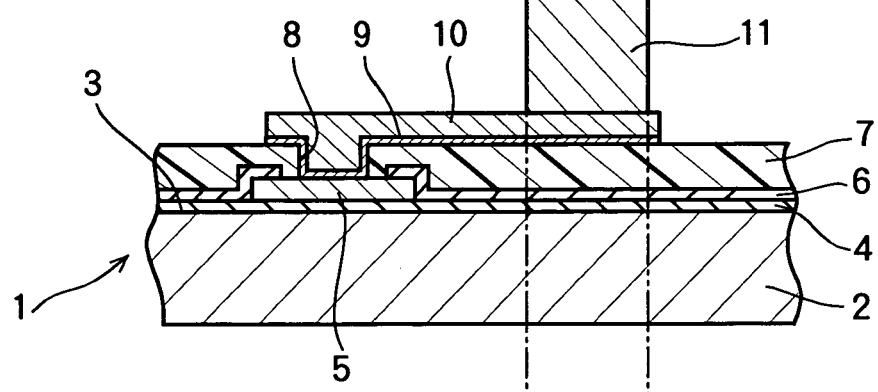
Figure 12C:
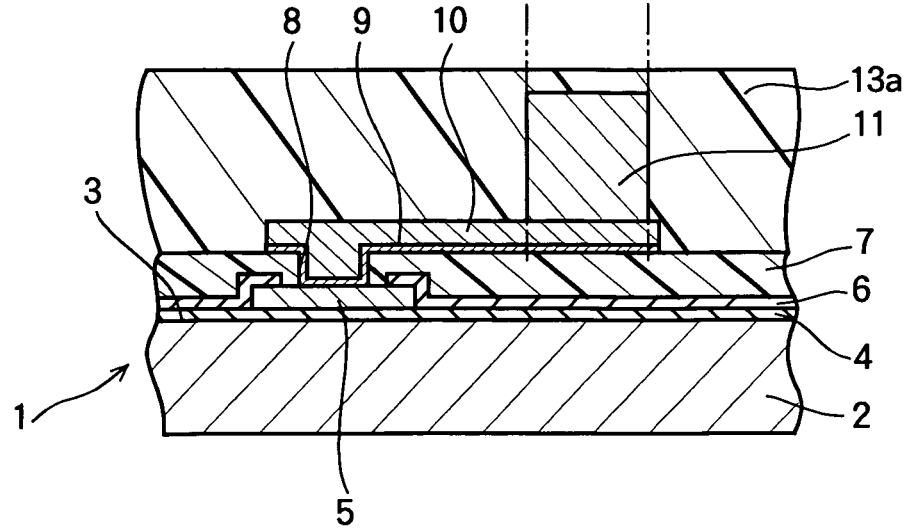

The adhesion film 13 has the thickness T shown in FIG. 3C preferably in the range from 5 µm to 40 µm. If the thickness of the adhesion film 13 is thinner than 5 µm, the difference in thermal expansion between the post electrode 11 and the sealing layer 15 cannot be absorbed, with the result that the separation between the post electrodes 11 and the sealing layer 15 may occur. If the thickness of the adhesion film 13 is thicker than 40 µm, there is a possibility that the circuit elements may be exposed to ultraviolet rays that has passed the adhesion film 13 (having light-transmission property) after the semiconductor device is mounted on the mounting substrate, and therefore memory of the circuit elements may be erased.

In this embodiment, the adhesion film 13 has the thickness of 10 µm.

Hereinafter, the manufacturing method of the semiconductor device according to the first embodiment will be described with reference to FIGS. 1A through 3C.

In the process P1 shown in FIG. 1A, a plurality of circuit elements (not shown) are formed on the circuit forming surface 3 of the semiconductor substrate 2 of the semiconductor wafer 1. The insulation layer 4 is formed on the semiconductor substrate 2 so that the insulation layer 4 has the contact holes (not shown) aligned with the respective circuit elements. Then, the conductive layer of Aluminum is formed on the insulation layer 4 using the sputtering method. The conductive layer is etched into a predetermined shape, to thereby form electrode pads 5 electrically connected to the predetermined portion of the circuit elements.

After the electrode pads 5 are formed, the surface protection film 6 composed of silicon nitride is formed to cover the electrode pads 5 and the insulation layer 4 using the CVD method. The surface of the surface protection film 6 is etched to thereby expose the electrode pads 5. The interlayer insulation film 7 of polyimide is formed on the surface protection film 6 and the electrode pads 5. The portions of the interlayer insulation film 7 above the electrode pads 5 are removed by etching, so as to form the through-holes 8 (reaching the electrode pads 5) on the interlayer insulation film 7.

Figure 1B:
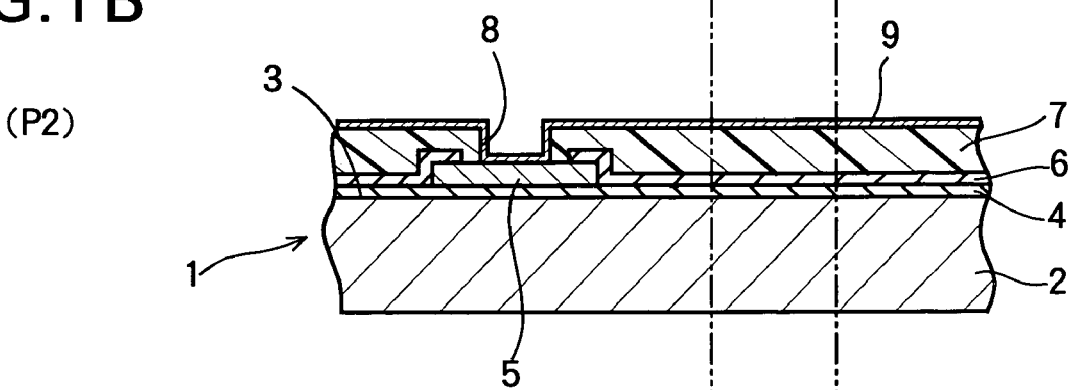

In the process P2 shown in FIG. 1B, the base metal layer 9 including a plurality of layers is formed on the upper side of the semiconductor wafer 1 using the sputtering method so that the base metal layer 9 covers the upper surface of the interlayer insulation film 7 and the upper surface of the electrode pads 5.

Figure 1C:
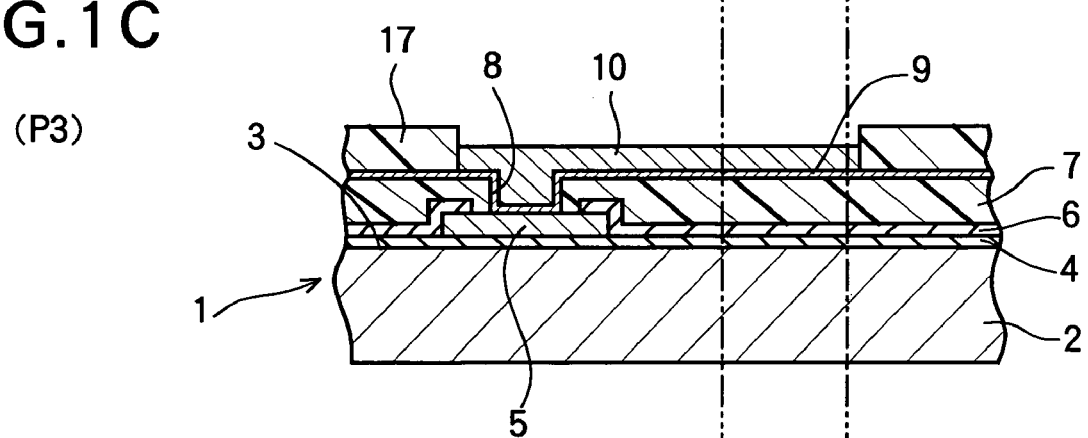

In the process P3 shown in FIG. 1C, a resist mask 17 is formed on the base metal layer 9 using photolithography, except the areas (extending from the electrode pads 5 to the electrode-forming areas 12) on which the connection wirings 10 are to be formed. Then, copper is electrodeposited on the exposed surface of the base metal layer 9 using the electro-plating method (in which the base metal layer 9 is used as the common electrode), so that the connection wirings 10 are formed. The connection wirings 10 extend from the electrode pads 5 to the electrode-forming areas 12.

Figure 1D:
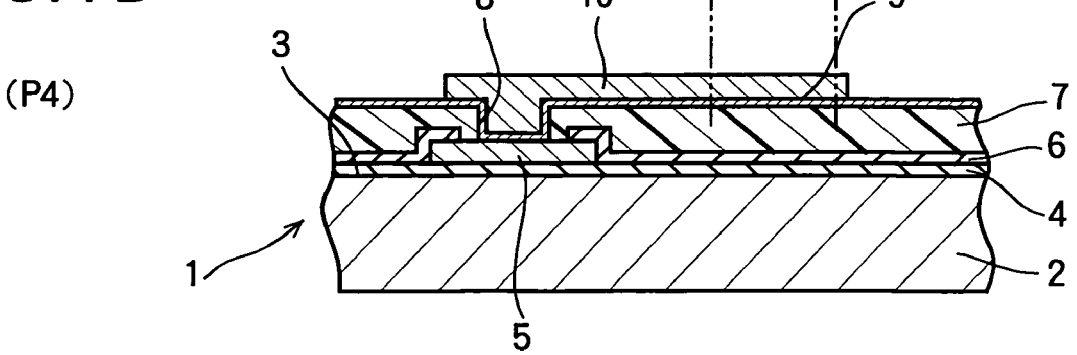

In the process P4 shown in FIG. 1D, the resist mask 17 having been formed in the process P3 is removed by etching using solvent such as acetone.

Figure 2A:
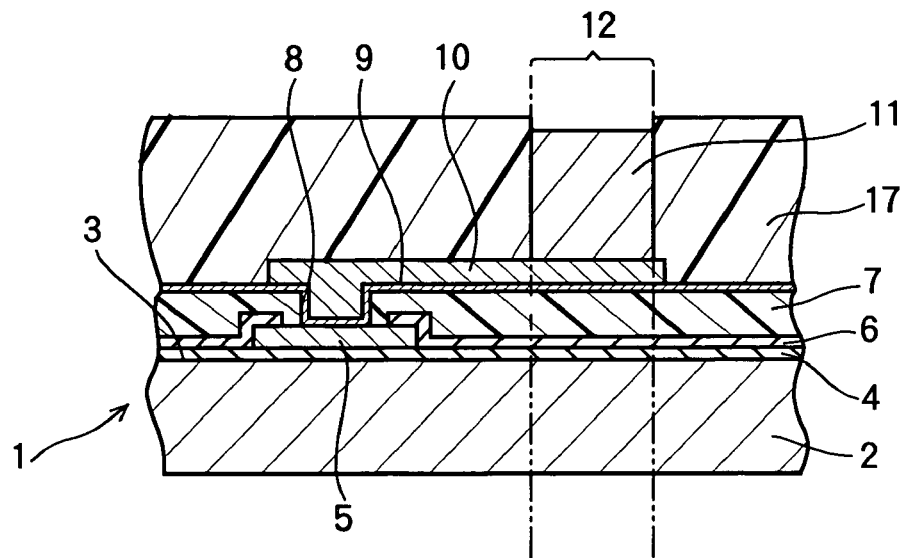
FIGS. 2A through 2C are sectional views illustrating processes P5 through P7 of the manufacturing method of the semiconductor device according to the first embodiment of the present invention.

In the process P5 shown in FIG. 2A, another resist mask 17 is formed on the upper side of the semiconductor wafer 1 using photolithography, except the electrode-forming areas 12 on the connection wirings 10. Then, copper is electrodeposited on the exposed surfaces of the connection wirings 10 using the electro-plating method in which the base metal layer 9 is used as the common electrode.

Figure 2B:
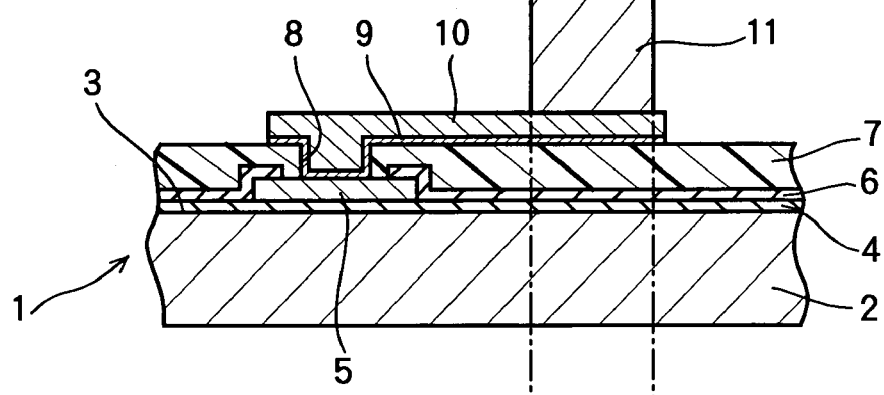

In the process P6 shown in FIG. 2B, the resist mask 17 having been formed in the process P5 is removed using solvent such as acetone. Further, the base metal layer 9 is removed using plasma etching in oxygen atmosphere, except the areas below the connection wirings 10 and below the post electrodes 11.

Figure 2C:
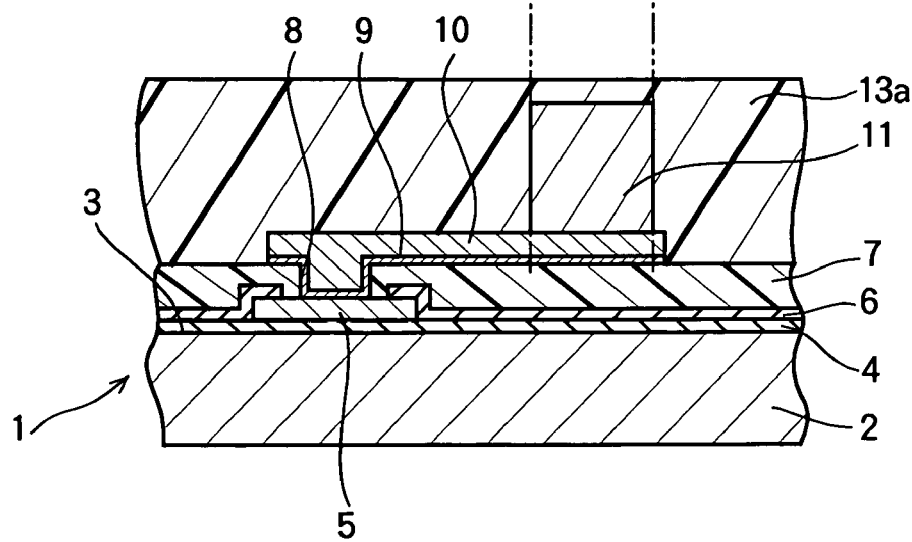

In the process P7 shown in FIG. 2C, the adhesion resin 13a of polyimide having negative photosensitivity is coated on the whole surface of the upper side of the semiconductor wafer 1 using a spin-coating method.

In the process P8 shown in FIG. 3A, a photo mask 18 is used to shield the upper side of adhesion resin 13a, except the electrode-forming areas 12 and except areas around the electrode-forming areas 12 (in this example, areas of 10 µm from the electrode-forming areas 12). The adhesion resin 13a is exposed to ultraviolet rays via the photo mask 18, so that the adhesion resin 13a around the post electrodes 11 are hardened.

In the process P9 shown in FIG. 3B, the non-exposed part of the adhesion resin 13a is removed by means of developing process. Then, the remaining adhesion resin 13a is heated and hardened, so that the adhesion film 13 covering the side surface of the post electrodes 11 is formed. The thickness of the adhesion film 13 is 10 µm.

If the adhesion resin 13a having the positive. photosensitivity is used, the process P9 can be carried out as follows. The photo mask 18 is configured to shield the electrode-forming areas 12 and the areas around the electrode-forming areas 12. The adhesion resin 13a is exposed via the photo mask 18, so that the exposed part of the adhesion resin 13a (i.e., the adhesion resin 13a except the electrode-forming areas 12 and except the areas around the electrode-forming areas 12) is softened. Then, the exposed part of the adhesion resin 13a is removed by means of developing process. Then, the remaining adhesion resin 13a is heated and hardened, so that the adhesion film 13 covering the side surfaces of the post electrodes 11 is formed.

In the process P10 shown in FIG. 3C, the semiconductor wafer 1 is placed in a sealed mold (not shown), and a sealing resin composed of thermosetting epoxy resin is injected into the sealed mold in such a manner that the sealing resin covers the whole surface of the upper side of the semiconductor wafer 1, i.e., the interlayer insulation film 7, the base metal layer 9, the connection wirings 10 and the adhesion film 13 (formed on the side surfaces of the post electrodes 11). Then, the sealing resin is heated and hardened, to thereby form the sealing layer 15. Then, the semiconductor wafer 1 is taken out of the sealed mold. The surface of the sealing layer 15 is polished so that the post end surfaces 11a of the post electrodes 11 and upper end surfaces of the adhesion film 13 (around the post electrodes 11) are exposed on the upper surface of the sealing layer 15 and so that the upper surface of the sealing layer 15 and the post end surfaces 11a are aligned with each other on the same plane.

Further, a flux is coated on the post end surfaces 11a exposed on the upper surface of the sealing layer 15. Then, a solder ball mounting tool (not shown) having the same diameter as the semiconductor wafer 1 is mounted on the upper surface of the semiconductor wafer 1. The solder ball mounting tool has guide holes (whose diameters are slightly larger than solder balls) on the respective electrode-forming areas 12. Then, solder balls are put into the guide holes, and placed on the post end surfaces 11a. Then, the solder ball mounting tool is removed. After the solder ball mounting tool is removed, the solder balls are heated and molten, so as to form the hemispheric bump electrodes 16 protruding from the post end surfaces 11a.

With the above described manufacturing method, the semiconductor wafer 1 with a plurality of semiconductor devices (before the division into respective pieces) is formed. By dividing the semiconductor wafer 1 into the respective pieces, the semiconductor device according to the first embodiment is obtained.

In the above manufactured semiconductor device, the side surfaces of the post electrodes 11 (formed of copper) tightly adhere to the sealing layer 15 via the adhesion film 13. Therefore, it becomes possible to prevent the separation between the post electrodes 11 and the sealing layer 15, even when the external stress is applied to the post electrodes 11 due to the difference in thermal expansion between the semiconductor device and the mounting substrate during a bonding process for bonding the bump electrodes 16 of the semiconductor device to the mounting substrate.

Moreover, the adhesion film 13 that transmits light is sufficiently thin, and the sealing layer 15 (i.e., thermosetting sealing resin having light shielding property) has the sufficient thickness to shield light. Therefore, even when the semiconductor device is exposed to light after the semiconductor device is mounted to the mounting substrate, the memory or the like in the circuit elements is not erased by ultraviolet rays.

As described above, according to the first embodiment of the present invention, the adhesion film is provided between the side surfaces of the post electrodes and the sealing layer, and the sealing layer is formed of the sealing resin having light-shielding property, with the result that the side surfaces of the post electrodes tightly adhere the sealing layer via the adhesion film. Accordingly, even when the external stress is applied to the post electrodes, it becomes possible to prevent the separation between the post electrodes and the sealing layer. As a result, it becomes possible to prevent the intrusion of the moisture or the like from outside, and it becomes possible to prevent the corrosion of the electrode pads and the connection wirings and the disconnection of the connection wirings caused by the repeatedly applied force. Thus, the reliability of connection of the semiconductor device can be enhanced. Furthermore, since the adhesion film is sealed by the. sealing layer having the light-shielding property, it becomes possible to prevent the circuit elements of the semiconductor device form being exposed to light such as ultraviolet rays after the semiconductor device is mounted to the mounting substrate, and therefore it becomes possible to prevent the memory of the circuit elements or the like from being erased.

Second Embodiment

FIGS. 4A through 4D, FIGS. 5A through 5C and FIGS. 6A through 6C illustrate a manufacturing method of a semiconductor device according to the second embodiment of the present invention.

The components of the semiconductor device of the second embodiment that are the same as those of the first embodiment are assigned the same reference numerals, and duplicate explanation will be omitted.

In the second embodiment, the thickness T (shown in FIG. 6C) of the adhesion film 13 is preferably in the range from 5 µm to 40 µm, as was described in the first embodiment. This is because of the following reason (in addition to the reason described in the first embodiment). If the adhesion film 13 is thinner than 5 µm, there may be cases where the adhesion film 13 is not formed on a stepped portion around the connection wirings 10. In such a case, the difference in thermal expansion between the sealing layer 15 and the connection wirings 10 (during the heat treatment for forming the bump electrodes 16) can not be absorbed, and separation may occur at a portion where the sealing layer 15 directly covers (i.e., contacts) the connection wirings 10.

In this embodiment, the thickness of the adhesion film 13 is 10 µm.

Hereinafter, the manufacturing method of the semiconductor device of the second embodiment will be described with reference to FIGS. 4A through 6C.

Processes PA1 through PA7 shown in FIGS. 4A through 5C are the same as the processes P1 through P7 (FIGS. 1A through 2C) of the first embodiment, and therefore the explanation thereof will be omitted.

In the process PA8 shown in FIG. 6A, the adhesion resin 13a around the post electrode 11 is exposed via the photo mask 18, and hardened as in the process P8 (FIG. 3A) of the first embodiment.

In the process PA9 shown in FIG. 6B, after the adhesion resin 13a is hardened, the developing process is carried out. In the developing process, the developing time is adjusted so that the non-exposed adhesion resin 13a (i.e., except the adhesion resin 13a on the post electrodes 11 and except the adhesion resin 13a around the post electrodes 11) remains in the form of a film on the upper side of the semiconductor wafer 1. Then, the residual non-exposed adhesion resin 13a is exposed to be hardened, and the hardened adhesion resin 13 is heated to be solidified, with the result that the adhesion film 13 of the thickness of approximately 10 µm is formed. The adhesion film 13 covers the side surfaces of the post electrodes 11 and the whole surface (including the connection wirings 10) of the upper side of the semiconductor wafer 1.

If the adhesion resin 13a having positive photosensitivity is used, the process PA9 can be carried out as follows. The photo mask 18 is configured to shield the electrode-forming areas 12 and the areas around the electrode-forming areas 12. The adhesion resin 13a is exposed via the photo mask 18. In the exposing process, the exposure time is adjusted so that the exposed part of the adhesion resin 13a (i.e., except the adhesion resin 13a on the post electrodes 11 and except the adhesion resin 13a around the post electrodes 11) is softened and the adhesion resin 13a remains in the form of a film on the upper side of the semiconductor wafer 1. The exposed (softened) adhesion resin 13a is removed by the developing process. The residual adhesion resin 13a is heated to be solidified, with the result that the adhesion film 13 covering the side surfaces of the post electrodes 11 and the whole surface (including the connection wirings 10) of the upper side of the semiconductor wafer 1 of the semiconductor wafer 1 is formed.

In the process PA10 shown in FIG. 6C, the semiconductor wafer 1 is placed in a sealed mold (not shown), and a sealing resin composed of thermosetting epoxy resin is injected into the sealed mold in such a manner that the sealing resin covers the whole surface of the upper side of the semiconductor wafer 1, i.e., the upper surface of the adhesion film 13 covering the base metal layer 9 and the connection wirings 10 on the interlayer insulation film 7 and covering the side surfaces of the post electrodes 11.

The polishing process of the sealing layer 15 and the forming process of the bump electrodes 16 are the same as those of the first embodiment, and therefore duplicate explanation is omitted.

With the above described manufacturing method, the semiconductor wafer 1 with a plurality of semiconductor devices (before the division into respective pieces) is formed. By dividing semiconductor wafer 1 into the respective pieces, the semiconductor device according to the second embodiment is obtained.

In the above manufactured semiconductor device of the second embodiment, the whole surface of the upper side of the semiconductor wafer 1 (as well as the side surfaces of the post electrodes 11 and the connection wirings 10) tightly adheres to the sealing layer 15 via the adhesion film 13. Therefore, it becomes possible to prevent the separation between the post electrodes 11 and the sealing layer 15, even when the external stress is applied to the post electrodes 11. Moreover, because of the tight adhesion between the post electrodes 11 and the sealing layer 15, it becomes possible to prevent the corrosion of the connection wirings 10 due to the moisture intruding from the side end of each semiconductor device or the like after the semiconductor devices are separated into respective pieces.

Additionally, the thin adhesion film 13 is sealed by the sealing layer 15 having light shielding property, and therefore the memory or the like in the circuit elements is not erased by ultraviolet rays or the like, as was described in the first embodiment.

As described above, according to the second embodiment of the present invention, since the adhesion film is provided between the connection wirings and the sealing layer of the semiconductor device, there are advantages that the corrosion of the connection wirings 10 due to moisture intruding from the side end of each semiconductor device can be prevented, and the disconnection of the connection wirings due to the repeatedly applied external stress can be prevented, in addition to the advantages of the first embodiment.

In the above described process PA9 (FIG. 6B), the adhesion film is described to be formed on the whole surface of the upper side of the semiconductor wafer. However, it is also possible to form the adhesion film on the connection wirings and the areas around the connection wirings and to seal the adhesion film by the sealing member, as will be described in the process PB3 (FIG. 8A) of the third embodiment. With such an arrangement, the above described advantages can be obtained.

In the above described process P9 (FIG. 3B) of the first embodiment and the process PA9 (FIG. 6B) of the second embodiment, the adhesion film 13 is formed by removing the adhesion resin 13a by the developing process, and hardening the residual adhesion resin 13a. However, in the processes P9 and PA9, it is also possible to only perform the developing process for removing the adhesion resin 13a. In such a case, the adhesion resin can be hardened together with the sealing resin, after the adhesion resin 13a is sealed by the sealing resin in the process P10 and PA10. With such a process, the heating process of the adhesion resin can be eliminated, and therefore the efficiency of the manufacturing method of the semiconductor device can be enhanced.

Third Embodiment

FIGS. 7A through 7E, FIGS. 8A through 8C, FIGS. 9A through 6C and FIG. 10 illustrate a manufacturing method of a semiconductor device according to the third embodiment of the present invention.

The components of the semiconductor device of the third embodiment that are the same as those of the first embodiment are assigned the same reference numerals, and duplicate explanation will be omitted.

In the third embodiment, the thickness T (shown in FIG. 10) of the adhesion film 13 is preferably in the range from 5 µm to 40 µm, as was described in the second embodiment.

In this embodiment, the thickness of the adhesion film 13 is 10 µm.

Hereinafter, the manufacturing method of the semiconductor device of the third embodiment will be described with reference to FIGS. 7A through 10.

The processes PB1 through PB4 shown in FIGS. 7A through 7D are the same as the processes P1 through P4 (FIGS. 1A through 1D) of the first embodiment, and therefore the explanation thereof will be omitted.

In the process PB5 shown in FIG. 7E, the adhesion resin 13a of the polyimide having negative photosensitivity is coated on the whole surface of the upper side of the semiconductor wafer 1 using the spin-coating method.

In the process PB6 shown in FIG. 8A, after the adhesion resin 13a is coated on the semiconductor wafer 1, the adhesion resin 13a is exposed to light via the photo mask 18. The photo mask 18 is configured to shield the adhesion resin 13a except the areas above the connection wirings 10 and except their surrounding areas (i.e., areas of 10 μm from the connection wirings 10, in this example) and shield the center portions of the electrode-forming areas 12. The center portion of each electrode-forming area 12 has the diameter larger than or equals to 60% of the diameter of the post electrode 11, and smaller than or equals to 80% of the diameter of the post electrode 11, in this example. With this process, the adhesion resin 13a on the connection wirings 10 and the adhesion resin 13a on the areas around the connection wirings 10 are hardened, except the center portion of the electrode-forming areas 12.

In the process PB7 shown in FIG. 8B, after the adhesion resin 13a is hardened, the non-exposed adhesion resin 13a is removed by the developing process. Then, the remaining adhesion resin 13a is heated and hardened, so that the adhesion film 13 having the thickness of 10 μm is formed. The adhesion film 13 covers the connection wirings 10 (except the center portions of the electrode-forming areas 12) and covers the base metal layer 9 around the connection wirings 10.

If the adhesion resin 13a having positive photosensitivity is used, the process PB7 can be carried out as follows. The photo mask 18 is configured to shield the adhesion resin 13a above the connection wirings 10 (except the center portions of the electrode-forming areas 12) and shield the adhesion resin 13a above the areas around the connection wirings 10. The adhesion resin 13a is exposed via the photo mask 18. The exposed part of the adhesion resin 13a (i.e., except the adhesion resin 13a above the connection wirings 10 and except the adhesion resin 13a above the areas around the connection wirings 10) is softened. The softened adhesion resin 13a is removed by the developing process. The remaining adhesion resin 13a is heated and hardened, so that the adhesion film 13 is formed. The adhesion film 13 covers the connection wirings 10 (except the center portions of the electrode-forming areas 12) and the base metal layer 9 around the connection wirings 10.

In the process PB8 (FIG. 8C), the post electrodes 11 are formed on the electrode-forming areas 12 of the connection wirings 10 in a similar manner to the process P5 (FIG. 2A) of the first embodiment. The post electrodes 11 are formed in such a manner that the adhesion film 13 extends into joining portions where the post electrodes 11 and the connection wirings 10 join with each other.

In the process PB9 (FIG. 9A), the base metal layer 9 is removed, except the areas below the adhesion film 13 (i.e., below the connection wirings 10 and the post electrodes 11). The removal of the base metal layer 9 is carried out in a similar manner to the process P6 (FIG. 2B) of the first embodiment.

In the process PB10 (FIG. 9B), the adhesion resin 13a is coated on the upper side of the semiconductor wafer 1 in a similar manner to the process P7 of the first embodiment. Then, the adhesion resin 13a around the post electrodes 11 is exposed via the photo mask 18, and is hardened in a similar manner to the process P8 (FIG. 3A) of the first embodiment.

In the process PB11 (FIG. 9C), after the adhesion resin 13a is hardened, the adhesion resin 13a is solidified in a similar manner to the process P9 (FIG. 3B) of the first embodiment, so that the adhesion film 13 is formed on the side surfaces of the post electrodes 11, and is connected to the adhesion film 13 having been formed on the connection wirings 10.

In the process PB12 (FIG. 10), the semiconductor wafer 1 is placed in the sealed mold (not shown), and a sealing resin is injected into the sealed mold in such a manner that the sealing resin covers the whole surface of the upper side of the semiconductor wafer 1, i.e., the interlayer insulation film 7, the adhesion film 13 formed on the base metal layer 9 and the connection wirings 10 and the adhesion film 13 formed on the side surfaces of the post electrodes 11. Then, the sealing resin is heated and hardened, so that the sealing layer 15 is formed.

The polishing process of the sealing layer 15 and the forming process of the bump electrodes 16 are the same as those of the process P10 of the first embodiment, and therefore duplicate explanation is omitted.

With the above described manufacturing method, the semiconductor wafer 1 with a plurality of semiconductor devices (before the division into respective pieces) is obtained. By dividing semiconductor wafer 1 into the respective pieces, the semiconductor device according to the third embodiment is obtained.

In the above manufactured semiconductor device of the third embodiment, the side surfaces of the post electrodes 11 and the connection wirings 10 tightly adhere to the sealing layer 15 via the adhesion film 13. Therefore, as was described in the second embodiment, it becomes possible to prevent the separation between the post electrodes 11 and the sealing layer 15, even when the external stress is applied to the post electrodes 11. Moreover, because of the tight adhesion between the post electrodes 11 and the sealing layer 15, it becomes possible to prevent the corrosion of the connection wirings 10 due to the moisture intruding from the side end of each semiconductor device or the like after the semiconductor devices are separated into respective pieces.

Moreover, the adhesion film 13 extends to the inside of the joining portions between the connection wirings 10 and the post electrodes 11, and therefore the stress applied to the post electrodes 11 by the external force can be relieved.

Additionally, the thin adhesion film 13 is sealed by the sealing layer 15 having light shielding property, and therefore the memory or the like in the circuit elements is not erased by ultraviolet rays or the like, as was described in the first embodiment.

As described above, according to the third embodiment of the present invention, since the adhesion film 13 extends to the inside of the joining portions between the connection wirings 10 and the post electrodes 11, there is an advantage that the stress applied to the post electrodes 11 by the external force can be relieved, in addition to the advantages of the second embodiment.

Fourth Embodiment

FIGS. 11A through 11D, FIGS. 12A through 12C, and FIGS. 13A through 13C illustrate a manufacturing method of a semiconductor device according to the fourth embodiment of the present invention.

The components of the semiconductor device of the fourth embodiment that are the same as those of the first embodiment are assigned the same reference numerals, and duplicate explanation will be omitted.

Hereinafter, the manufacturing method of the semiconductor device of the third embodiment will be described with reference to FIGS. 11A through 13C.

The adhesion film 13 shown in FIG. 13 is formed on the side surface of each post electrode 11 by means of photolithography using the adhesion resin described in the first embodiment in such a manner that the circumference of the adhesion film 13 forms a conical surface 20 (for example, a surface of circular truncated cone) whose diameter decreases toward the upper end of the post electrode 11. In a particular example, the conical surface 20 is so shaped that the thickness of the adhesion film 13 decreases from 10 μm (at the joining portion with the connection wirings 10) to 1 μm (at the portion of the post end surface 11a).

The processes PC1 through PC7 shown in FIGS. 11A through 12C are the same as the processes P1 through P7 (FIGS. 1A through 2C) of the first embodiment, and therefore the explanation thereof will be omitted.

Figure 13A:
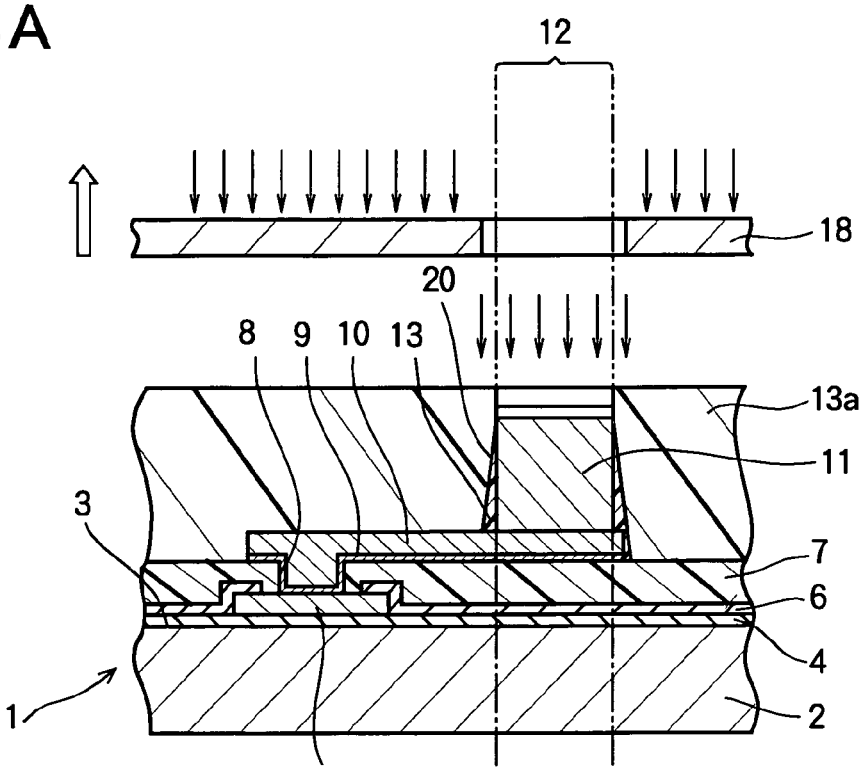
FIGS. 13A through 13C are sectional views illustrating processes PC8 through PC10 of the manufacturing method of the semiconductor device according to the fourth embodiment of the present invention.

In the process PC8 shown in FIG. 13A, after the adhesion resin 13a is coated, the semiconductor wafer 1 is exposed to light using the photo mask 18 that shields the adhesion resin 13a except the electrode-forming areas 12 and except the areas around the electrode-forming areas 12 as described in the process P8 (FIG. 3A) of the first embodiment. The exposure process is carried out in such a manner that the distance between the photo mask 18 and the semiconductor wafer 1 is increased. In other words, the exposure process is carried out in such a manner that the exposing device is moved away from the semiconductor wafer 1. With this process, the adhesion film 13a around the post electrodes 11 is hardened so that the circumference of the hardened adhesion resin 13a forms the conical surface 20 whose diameter decreases toward the upper end of the post electrode 11.

Figure 13B:
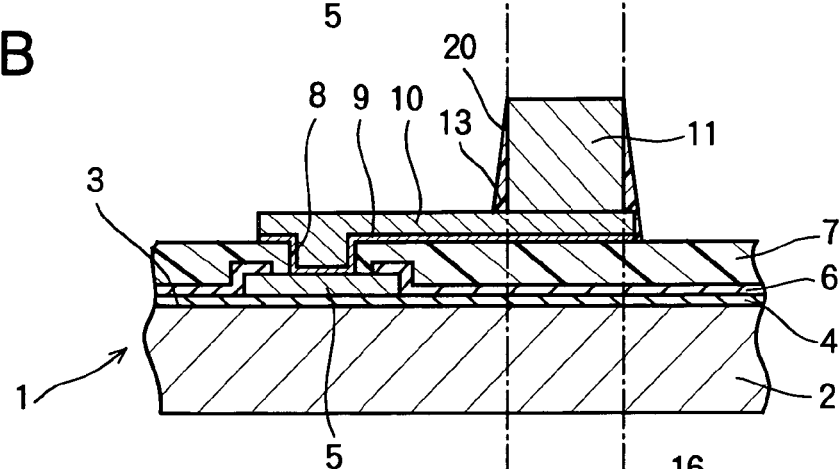
Figure 13C:
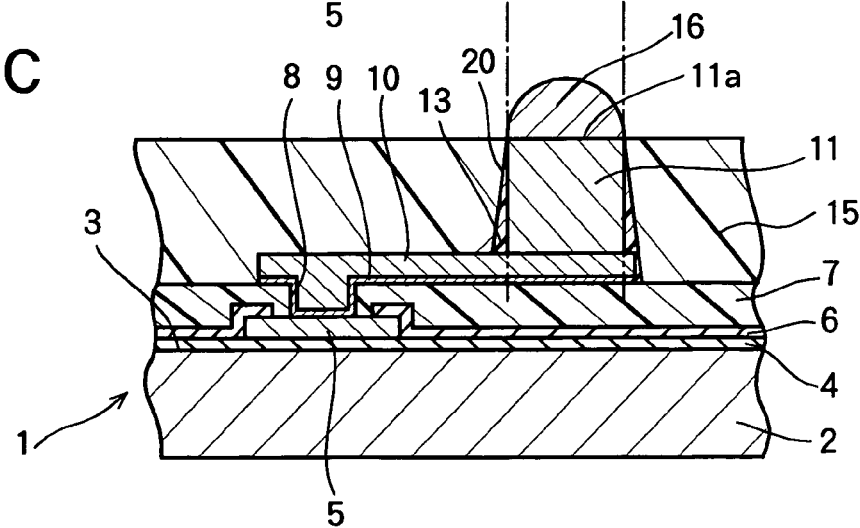

In the process PC9 shown in FIG. 13B, after the adhesion resin 13a is hardened, the non-exposed adhesion resin 13a is removed by the developing process. Then, the remaining adhesion resin 13a is heated and hardened, so as to form the adhesion film 13 on the side surfaces of the post electrodes 11 having the conical surface 20 whose diameter is 10 μm at the connection wirings 10 side and is 1 μm at the post end surface 11a side.

If the adhesion resin 13a of the positive photosensitivity is used, the process PC9 can be carried out as follows. The photo mask 18 is configured to shield the electrode-forming areas 12 and the areas around the electrode-forming areas 12. The adhesion resin 13a is exposed to light via the photo mask 18 in such a manner that the distance between the photo mask 18 and the semiconductor wafer 1 is increased. The part of the adhesion resin 13a except the inside area of the conical surface 20 is softened. The softened adhesion resin 13a is removed by the developing process. The remaining adhesion resin 13a is heated and hardened, so that the adhesion film 13 having the conical surface 20 is formed on the side surfaces of the post electrodes 11.

In the process PC10 (FIG. 13C), the semiconductor wafer 1 is placed in the sealed mold (not shown), and a sealing resin is injected into the sealed mold in such a manner that the sealing resin covers the whole surface of the upper side of the semiconductor wafer 1, i.e., the interlayer insulation film 7, the base metal layer 9, the connection wirings 10 and the adhesion film 13 having the conical surface 20 (formed on the side surfaces of the post electrodes 11). Then, the sealing resin is heated and hardened, so that the sealing layer 15 is formed.

The polishing process of the sealing layer 15 and the forming process of the bump electrodes 16 are the same as those of the process P10 of the first embodiment, and therefore duplicate explanation is omitted.

With the above described manufacturing process, the semiconductor wafer 1 with a plurality of semiconductor devices (before the division into respective pieces) is obtained. By dividing semiconductor wafer 1 into the respective pieces, the semiconductor device according to the fourth embodiment is obtained.

In the above manufactured semiconductor device of the fourth embodiment, the side surfaces of the post electrodes 11 tightly adhere the sealing layer 15 via the adhesion film 13. Therefore, as was described in the first embodiment, the separation between the post electrodes 11 and the sealing layer 15 can be prevented, even when the external stress is applied to the post electrodes 11.

Further, the thin adhesion film 13 is sealed by the sealing layer 15 having light shielding property, and therefore the memory or the like in the circuit elements is not erased by ultraviolet rays or the like, as was described in the first embodiment.

Moreover, the adhesion film 13 around the post electrode 11 has the conical surface 20, and the adhesion film 13 (that transmits light) is not substantially exposed at the upper surface of the sealing layer 15. Therefore, the light shielding property of the semiconductor device (protecting the circuit elements from light) can be further enhanced.

As described above, according to the fourth embodiment of the present invention, the adhesion film formed around each post electrode has the conical surface, and the adhesion film (that transmits light) is not substantially exposed at the upper surface of the sealing layer. Therefore, there is an advantage that the light shielding property of the semiconductor device (protecting the circuit elements from light) can be further enhanced, in addition to the advantages of the first embodiment.

The fourth embodiment can be applicable to any of the first, second and third embodiments. In other words, if the adhesion film (having the uniform thickness) on the side surface of the post electrode of the first, second or third embodiment is replaced with the adhesion film having the conical surface as described in the fourth embodiment, the above described advantage can be obtained.

The above described semiconductor device is configured to prevent the separation of the post electrodes and the sealing layer using the adhesion film, and to remove the influence of outside light (such as ultraviolet rays) using the sealing layer having light shielding property. Therefore, the semiconductor device can be used as a CSP type semiconductor device that contributes the stability of the quality of the electronic appliance for various kinds of applications.

According to the embodiments of the present invention, the manufacturing method of a semiconductor device includes the steps of:

forming an electrode pad electrically connected to a circuit element formed on a semiconductor substrate;

forming a connection wiring that reach an electrode-forming area for forming a post electrode from the electrode pad;

forming the post electrode on the electrode-forming area;

covering a side surface of the post electrode using an adhesion film, and sealing a surface of the adhesion film and the connection wiring using a sealing resin having light-shielding property.

In the step of covering the side surface of the post electrode, it is possible to cover the side surface of the post electrode and the connection wiring using the adhesion film.

Further, it is possible to provide the step of covering the connection wiring except a center portion of the electrode-forming area using the adhesion film.

Furthermore, the thickness of the adhesion film can be thicker than or equals to 5 µm, and thinner than or equals to 40 µm.

Moreover, it is possible that the adhesion film around the post electrode forms a conical surface whose diameter decreases toward an end of the post electrode.

Additionally, it is possible to form the adhesion film of polyimide resin.

In addition, it is possible to form the sealing layer of thermosetting epoxy resin.

While the preferred embodiments of the present invention have been illustrated in detail, it should be apparent that modifications and improvements may be made to the invention without departing from the spirit and scope of the invention as described in the following claims.

What is claimed is:

1. A semiconductor device comprising:
   a semiconductor substrate;
   an electrode pad electrically connected to a circuit element formed on said semiconductor substrate;
   a connection wiring electrically connected to said electrode pad and extending on said semiconductor substrate;
   a post electrode formed on said connection wiring;
   an adhesion film formed to cover a side surface of said post electrode, and
   a sealing layer that has light-shielding property and seals the surface of said adhesion film and said connection wirings,
   wherein said adhesion film exists between said side surface of said post electrode and said sealing layer.

2. The semiconductor device according to claim 1, wherein said adhesion film is formed between said connection wiring and said sealing layer.

3. The semiconductor device according to claim 1, wherein said adhesion film is provided between said connection wiring and said sealing layer, and said adhesion film extends into a joining portion where said post electrode and said connection wiring join with each other.

4. The semiconductor device according to claim 1, wherein the thickness of said adhesion film is thicker than or equals to 5 µm, and thinner than or equals to 40 µm.

5. The semiconductor device according to claim 1, wherein said adhesion film covering said side surface of said post electrode forms a conical surface whose diameter decreases toward an end of said post electrode.

6. The semiconductor device according to claim 1, wherein said adhesion film is formed of polyimide resin.

7. The semiconductor device according to claim 1, wherein said sealing layer is formed of thermosetting epoxy resin.

8. The semiconductor device according to claim 1, wherein said adhesion film directly contacts and adheres to said post electrode and said sealing layer.

9. A semiconductor device comprising:
   a semiconductor substrate;
   an electrode pad electrically connected to a circuit element formed on said semiconductor substrate;
   a connection wiring electrically connected to said electrode pad and extending on said semiconductor substrate;
   a post electrode formed on said connection wiring;
   an adhesion film formed to cover a side surface of said post electrode, and
   a sealing layer that has light-shielding property and seals the surface of said adhesion film and said connection wiring,
   wherein said adhesion film is formed between said connection wiring and said sealing layer.

10. A semiconductor device comprising:
    a semiconductor substrate;
    an electrode pad electrically connected to a circuit element formed on said semiconductor substrate;
    a connection wiring electrically connected to said electrode pad and extending on said semiconductor substrate;
    a post electrode formed on said connection wiring;
    an adhesion film formed to cover a side surface of said post electrode, and
    a sealing layer that has light-shielding property and seals the surface of said adhesion film and said connection wiring,
    wherein said adhesion film is provided between said connection wiring and said sealing layer, and said adhesion film extends into a joining portion where said post electrode and said connection wiring join with each other.

* * * * *